(12) United States Patent
Morikawa et al.

(10) Patent No.: US 12,503,633 B2
(45) Date of Patent: Dec. 23, 2025

(54) DIAMOND COMPOSITE MATERIAL AND HEAT RADIATING MEMBER

(71) Applicant: A.L.M.T. Corp., Tokyo (JP)

(72) Inventors: Tatsuya Morikawa, Toyama (JP); Takanori Kadokura, Toyama (JP); Kensuke Osawa, Toyama (JP)

(73) Assignee: A.L.M.T. Corp., Tokyo (JP)

( * ) Notice: Subject to any disclaimer, the term of this patent is extended or adjusted under 35 U.S.C. 154(b) by 0 days.

(21) Appl. No.: 15/327,269

(22) PCT Filed: Sep. 1, 2015

(86) PCT No.: PCT/JP2015/074880
§ 371 (c)(1),
(2) Date: Jan. 18, 2017

(87) PCT Pub. No.: WO2016/035795
PCT Pub. Date: Mar. 10, 2016

(65) Prior Publication Data
US 2017/0145280 A1    May 25, 2017

(30) Foreign Application Priority Data
Sep. 2, 2014   (JP) ................. 2014-178434

(51) Int. Cl.
| | |
|---|---|
| C09K 5/14 | (2006.01) |
| B22F 1/00 | (2022.01) |
| C22C 1/04 | (2023.01) |
| C22C 5/06 | (2006.01) |
| C22C 5/08 | (2006.01) |
| C22C 26/00 | (2006.01) |
| H01L 21/48 | (2006.01) |
| H01L 23/373 | (2006.01) |
| B22F 7/06 | (2006.01) |
| B22F 7/08 | (2006.01) |
| C22C 1/10 | (2023.01) |

(52) U.S. Cl.
CPC ............... *C09K 5/14* (2013.01); *B22F 1/00* (2013.01); *C22C 1/0466* (2013.01); *C22C 5/06* (2013.01); *C22C 5/08* (2013.01); *C22C 26/00* (2013.01); *H01L 21/4871* (2013.01); *H01L 23/3732* (2013.01); *H01L 23/3735* (2013.01); *B22F 2007/066* (2013.01); *B22F 7/08* (2013.01); *B22F 2301/255* (2013.01); *B22F 2302/05* (2013.01); *B22F 2302/20* (2013.01); *B22F 2302/406* (2013.01); *B22F 2302/45* (2013.01); *B22F 2304/10* (2013.01); *B22F 2998/10* (2013.01); *B22F 2999/00* (2013.01); *C22C 1/1073* (2023.01); *C22C 2026/005* (2013.01); *C22C 2026/006* (2013.01); *C22C 2026/007* (2013.01); *C22C 2026/008* (2013.01)

(58) Field of Classification Search
CPC .... C09K 5/00; C09K 5/08; C09K 5/14; F28F 7/00
USPC ............ 252/77; 427/180; 428/403; 165/185
See application file for complete search history.

(56) References Cited

U.S. PATENT DOCUMENTS

| | | | | |
|---|---|---|---|---|
| 3,650,714 A | * | 3/1972 | Farkas ................. | C04B 41/009 228/124.1 |
| 5,834,115 A | * | 11/1998 | Weeks, Jr. ........ | C04B 35/62831 257/E23.027 |
| 6,096,414 A | * | 8/2000 | Young ..................... | C09K 5/14 428/447 |
| 6,485,831 B1 | * | 11/2002 | Fukushima ......... | C23C 18/1641 428/404 |
| 2003/0106270 A1 | * | 6/2003 | Baldoni ................. | C23C 18/08 428/404 |
| 2004/0119161 A1 | | 6/2004 | Saito et al. | |
| 2004/0146640 A1 | * | 7/2004 | Ott ..................... | B23K 35/0244 427/383.1 |
| 2005/0051891 A1 | | 3/2005 | Yoshida et al. | |
| 2008/0187769 A1 | * | 8/2008 | Huzinec ................. | B22F 1/025 428/457 |
| 2010/0206941 A1 | * | 8/2010 | Egan .................... | C09K 3/1445 427/249.1 |

(Continued)

FOREIGN PATENT DOCUMENTS

| | | |
|---|---|---|
| CN | 1529357 A | 9/2004 |
| CN | 1944698 A | 4/2007 |

(Continued)

OTHER PUBLICATIONS

International Search Report in counterpart International Application No. PCT/JP2015/074880, dated Nov. 24, 2015.
Communication issued in counterpart European Application No. 15838762.1, dated Mar. 15, 2018.
Office Action mailed Jun. 25, 2019 in the counterpart divisional JP Patent Application No. 2018-020004.
Notification of the First Office Action issued in counterpart Chinese Patent Application No. 201910978537.8 dated Dec. 24, 2020.
Sun et al., "Manufacturing Theory and Practice of Diamond Tool," 2005, pp. 260-262.

(Continued)

*Primary Examiner* — Jane L Stanley
(74) *Attorney, Agent, or Firm* — McCarter & English, LLP; Michael A. Sartori

(57) ABSTRACT

Provided are a diamond composite material which is excellent in thermal conductivity, suitable as a material for a heat radiating member, and dense, the heat radiating member, and a method for producing a diamond composite material that can productively produce a diamond composite material which is excellent in wettability between diamond and metal and dense. The diamond composite material includes: a coated diamond particle including a diamond particle and a carbide layer covering a surface of the diamond particle and including an element of group 4 of the periodic table; and silver or a silver alloy binding such coated diamond particles together, with an oxygen content of 0.1 mass % or less.

10 Claims, 5 Drawing Sheets

(56) References Cited

U.S. PATENT DOCUMENTS

2010/0319900 A1* 12/2010 Abyzov .................. C22C 26/00
                                                                                                  165/185
2014/0001624 A1    1/2014 Wityak et al.

FOREIGN PATENT DOCUMENTS

| | | |
|---|---|---|
| CN | 101035876 A | 9/2007 |
| CN | 101985702 A | 3/2011 |
| EP | 0946332 A | 10/1999 |
| JP | S37-003117 | 5/1962 |
| JP | S47-044134 | 11/1972 |
| JP | 2004-197153 A | 7/2004 |
| JP | 2004-200346 A | 7/2004 |
| JP | 2005-179731 A | 7/2005 |
| JP | 2013-115096 A | 6/2013 |
| WO | 98/24593 A1 | 6/1998 |
| WO | 03/040420 A1 | 5/2003 |

OTHER PUBLICATIONS

Song et al., "Manual of Synthetic Diamond Tools," Jan. 31, 2014, pp. 519-522.
Communication cited in Chinese Application No. 202111355188.8 dated Apr. 1, 2022.

* cited by examiner

BACKSCATTERED ELECTRON IMAGE

C IMAGE

O IMAGE

Ti IMAGE

DIAMOND COMPOSITE MATERIAL AND HEAT RADIATING MEMBER

TECHNICAL FIELD

The present invention relates to a composite material in which diamond and metal are composited together and its production method, and a heat radiating member composed of this composite material. In particular, the present invention relates to a diamond composite material which is excellent in thermal conductivity, suitable as a material for a heat radiating member, and dense, and a method for producing a diamond composite material that can productively produce a diamond composite material which is excellent in wettability between diamond and metal and dense.

BACKGROUND ART

Semiconductor elements are increasingly developed to achieve higher integration, higher power and higher speed. Accordingly, it is necessary to cause a semiconductor element to dissipate heat sufficiently to prevent the semiconductor element from reaching an operating upper limit temperature. Conventionally, enabling a semiconductor element to dissipate heat utilizes natural convection and forced ventilation as well as a heat dissipating member (referred to as a heat sink, a heat spreader etc.) for extending a heat radiating surface.

As a material for a heat radiating member which is required to present particularly high heat radiation, a composite material of diamond having high thermal conductivity and a metal has been considered. Patent document 1 discloses a composite material of diamond and an Ag—Cu alloy. Patent document 2 discloses a composite material of diamond and copper.

CITATION LIST

Patent Documents

Patent document 1: Japanese Patent Laying-Open No. 2004-197153
Patent document 2: WO2003/040420

SUMMARY OF INVENTION

Technical Problem

Diamond is inferior in wettability with metal in general. As a result, when diamond and metal are composited together, voids result in a vicinity of an interface of the diamond and the metal and invite reduction in density and thermal conductivity of the composite material. Accordingly, there is a demand for developing a composite material of diamond and metal that is utilized as a material for a heat radiating member for a semiconductor element or the like, that has few voids and is dense and excellent in thermal conductivity.

Patent document 1 discloses a configuration in which Ti powder is used as a raw material and diamond per se and Ti are made to react to form a carbide of Ti on a surface of a diamond particle, and the carbide of Ti and an Ag—Cu alloy get wet to cause the diamond particle and the Ag—Cu alloy to adhere closely to each other via the carbide of Ti. However, Ti or a similar group 4 element in the periodic table 4 easily bonds with oxygen in general, and oxide film may be present on a surface of a powder particle of Ti. This oxide film inhibits a reaction of diamond and Ti and wettability is insufficiently enhanced, which may invite reduction in density of the composite material and reduction in thermal conductivity of the composite material resulting from voids. An oxide which may remain in the composite material may also invite reduction in thermal conductivity.

Furthermore, in patent document 1, silver powder, a silver plate, etc. are used as a raw material. Silver may per se contain oxygen, and accordingly, oxygen discharged from silver and an element of group 4 of the periodic table, such as Ti, bond together to form an oxide, which may inhibit a reaction of diamond and Ti.

Furthermore, industrial diamond may have remaining on a surface of a powder particle of diamond an oxide resulting from a reagent etc. which is used for production of the diamond (e.g., oxides of Cr, Fe, etc.). This oxide can also serve as a factor which inhibits a reaction of diamond and an element of group 4 of the periodic table such as Ti.

Reference 2 discloses a production method in which a green compact of diamond powder and copper powder is introduced into a capsule made of Mo and sintered under an ultra-high pressure, and subsequently, the capsule is ground and thus removed. The reference indicates that by this production method, a dense composite material is obtained and no oxide is formed in the copper. However, this composite material only has the diamond and the copper in contact with each other, rather than bound to each other, and when it is used as a heat radiating member, it experiences a cold and hot cycle repeatedly, and a gap may result at an interface of the diamond and the copper and impair a thermal property. Furthermore, this production method requires equipment capable of generating and controlling ultra-high pressure and is thus inferior in productivity of the composite material. Accordingly, there is a demand for a method for producing a diamond composite material, which is a more convenient production method and can also reduce and remove an oxide which can invite reduction in thermal conductivity.

Accordingly, one object of the present invention is to provide a diamond composite material which is excellent in thermal conductivity and dense, and a heat radiating member. Furthermore, another object of the present invention is to provide a method for producing a diamond composite material that can productively produce a diamond composite material which is excellent in wettability between diamond and metal and dense.

Solution to Problem

A diamond composite material according to one manner of the present invention comprises: a coated diamond particle including a diamond particle and a carbide layer covering a surface of the diamond particle and including an element of group 4 of the periodic table; and silver or a silver alloy binding such coated diamond particles together, with an oxygen content of 0.1 mass % or less.

As a method for producing the above diamond composite material, the following production method is mentioned, for example. The method for producing the diamond composite material comprises the following preparation step, filling step and infiltration step.

(Preparation step) The step of preparing as raw materials a powder of diamond, a powder of one or more types of group 4 compounds selected from a sulfide, a nitride, a hydride and a boride including an element of group 4 of the periodic table, and a metal material including silver or a silver alloy.

(Filling step) The step of introducing the above powder of diamond, the above powder of the group 4 compound, and the above metal material into a die.

(Infiltration step) The step of heating the matters introduced in the die to composite together the above diamond and the above silver or silver alloy molten.

Advantageous Effects of Invention

The above diamond composite material is excellent in thermal conductivity and dense. The above method for producing a diamond composite material is excellent in wettability between diamond and metal and can easily produce a dense diamond composite material.

DESCRIPTION OF EMBODIMENTS

Figure 1:
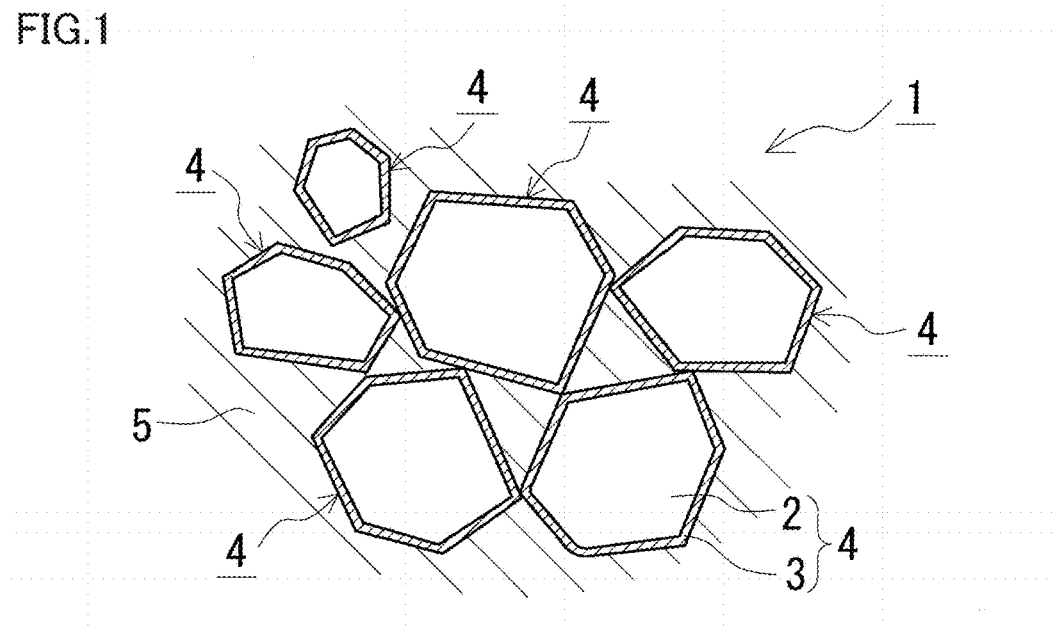
FIG. 1 is a schematic partial cross section of a diamond composite material according to an embodiment.

Description of Embodiments of the Present Invention

Initially, embodiments of the present invention will be enumerated and described.

(1) A diamond composite material according to one manner of the present invention comprises a coated diamond particle including a diamond particle and a carbide layer covering a surface of the above diamond particle and including an element of group 4 of the periodic table, and silver or a silver alloy binding such coated diamond particles together, with an oxygen content of 0.1 mass % or less. The period table as referred to herein is the long period table represented by the new IUPAC nomenclature.

The above diamond composite material is dense and excellent in thermal conductivity for the following points.

(Being Dense)

The above diamond composite material has an oxygen content of 0.1 mass % or less and thus has little oxygen. Accordingly, it can be said that there is only a little oxygen, preferably no oxygen, present throughout the composite material including an interface of a diamond particle and a carbide layer including an element of group 4 of the periodic table and a vicinity thereof, and there is no oxide substantially present on a surface of the diamond particle or in the above carbide layer, either. It is believed that such a diamond composite material as above, in its production process, suppresses formation of voids leading to reduction in density and the carbide layer is easily, soundly formed on a surface of diamond. As a result, the diamond and the carbide layer including the element of group 4 of the periodic table closely adhere to each other.

Since there is no oxide substantially present in the above carbide layer, it can be said that the element of group 4 of the periodic table which is present around a diamond particle is present mainly as a carbide. Furthermore, it can be said that there is no oxide substantially present, either, in the silver or the silver alloy (hereinafter also referred to as a metal matrix). It is believed that such a diamond composite material as above, in its production process, allows wettability between the carbide layer including the element of group 4 of the periodic table and a molten metal which forms the metal matrix to be sufficiently enhanced and has sufficiently suppressed formation of voids leading to reduction in density. As a result, the carbide layer including the element of group 4 of the periodic table and the metal matrix closely adhere to each other.

Voids in the metal matrix are also sufficiently reduced.

(Thermal Conductivity)

The diamond composite material comprises as major components a diamond particle having a thermal conductivity of 1000 W/m·K or more and silver or a silver alloy having a tendency to have a thermal conductivity higher than that of copper, a copper alloy, etc.

As has been discussed above, there is only a little oxygen, preferably no oxygen, present throughout the composite material including a vicinity of diamond particles, that is, an oxide inferior in thermal conductivity is present in a small amount, preferably no such oxide is present.

The diamond composite material has diamond particles bound by the metal matrix densely, and a heat conduction path that connects the diamond particle, the carbide and the metal matrix, a heat conduction path that is formed by the carbides formed on the surfaces of the diamond particles, that are successively connected together, etc. can be satisfactorily constructed.

Furthermore, the above diamond composite material includes both a diamond particle having a coefficient of thermal expansion equal to or less than about $2.3 \times 10^{-6}$/K and a metal matrix having a larger coefficient of thermal expansion than diamond, and thus has its coefficient of thermal expansion close to the coefficient of thermal expansion of a semiconductor element, a peripheral component of a semiconductor device, etc. (i.e., having a small difference and thus being excellent in consistency). Accordingly, the above diamond composite material can be suitably used as a material for a heat radiating member of a semiconductor element.

(2) As an example of the above diamond composite material, a form having a relative density of 96.5% or more is mentioned.

The above form is dense and has few voids, and can reduce reduction in thermal conductivity attributed to voids and thus has high thermal conductivity.

(3) As an example of the above diamond composite material, a form in which the above diamond particle has an average particle diameter of 1 μm or more and 300 μm or less is mentioned.

The above form can suppress reduction in thermal conductivity attributed to excessively small diamond particles and hence excessive diamond powder particle boundaries in the composite material, and thus has high thermal conductivity. And the above form can suppress reduction in workability, such as grinding, attributed to excessively large diamond particles, and facilitates adjusting a dimension, a shape, etc. by grinding etc.

(4) As an example of the above diamond composite material, a form in which the content of the above diamond particles is 30 volume % or more and 90 volume % or less is mentioned.

The above form includes sufficient diamond particles and is thus excellent in thermal conductivity. The above form can also suppress poor infiltration attributed to excessive diamond particles (occurrence of an uninfiltrated portion), and is thus excellent in productivity.

(5) As an example of the above diamond composite material, a form having a thermal conductivity of 500 W/m·K or more at a room temperature is mentioned. As the room temperature, about 20° C. or more and about 27° C. or less under the atmospheric pressure is mentioned.

The above form has a significantly high thermal conductivity, and can suitably be used as a material for a heat radiating member of a semiconductor element required to present high heat radiation.

(6) As an example of the above diamond composite material, a form having a coefficient of thermal expansion, as averaged, of $3 \times 10^{-6}$/K or more and $13 \times 10^{-6}$/K or less at 30° C. to 150° C. is mentioned.

The above form is excellent in consistency with the coefficient of thermal expansion of a semiconductor element (e.g., GaN: about $5.5 \times 10^{-6}$/K etc.), the coefficient of thermal expansion of a peripheral component such as a package, etc. and can suitably be used as a material for a heat radiating member of a semiconductor element.

(7) As an example of the above diamond composite material, a form having a cold and hot cycle endurance of 95% or more at −60° C. to +250° C. is mentioned. The cold and hot cycle endurance is set to (thermal conductivity after cold and hot cycle/thermal conductivity before cold and hot cycle)×100.

When the diamond composite material that has a small oxygen content, is dense and has a high thermal conductivity, as described above, undergoes a cold and hot cycle of −60° C. to +250° C., it has small reduction in thermal conductivity and can thus maintain high thermal conductivity. Accordingly, the above form can suitably be used as a material for a heat radiating member of a semiconductor element undergoing a cold and hot cycle in use.

(8) As an example of the above diamond composite material, a form having a thermal conductivity degradation rate less than 5% after it is heated to 800° C. is mentioned. The degradation rate is set to {[(thermal conductivity before heating)−(thermal conductivity after heating)]/(thermal conductivity before heating)}×100.

When the diamond composite material that has a small oxygen content, is dense and has a high thermal conductivity, that is in the above form is heated to a high temperature such as 800° C., it can still maintain high thermal conductivity and is excellent in heat resistance. Such a form as above can suitably be used for example for a material for a heat radiating member of a semiconductor element to which an insulating material etc. composed of ceramics etc. may be bonded using a bonding material of a high melting point such as a silver brazing material (having a melting point of about 780° C.).

(9) As an example of the above diamond composite material, a form further including a metal layer which covers at least a portion of a surface of the above diamond composite material, the above metal layer having a thickness of 1 μm or more and 300 μm or less, is mentioned.

The above form, including the metal layer, easily becomes smooth and is excellent in surface quality. Furthermore, when this form is utilized for a heat radiating member of a semiconductor element, the metal layer can be utilized as an underlying material for solder, a brazing material etc. to firmly bond the semiconductor element and the heat radiating member together.

(10) A heat radiating member according to one manner of the present invention is composed of the diamond composite material of any one of items (1) to (9).

The above heat radiating member composed of the above diamond composite material which is dense and excellent in thermal conductivity, is dense and excellent in thermal conductivity. Since the above diamond composite material is also excellent in consistency with the coefficient of thermal expansion of a semiconductor element, the above heat radiating member can be suitably used as a heat radiating member of the semiconductor element.

As a method for producing the above diamond composite material, the following production method is mentioned, for example.

(m1) The method for producing the diamond composite material includes a preparation step, a filling step, and an infiltration step, as follows:

(Preparation step) The step of preparing as raw materials a powder of diamond, a powder of one or more types of group 4 compounds selected from a sulfide, a nitride, a hydride and a boride including an element of group 4 of the periodic table, and a metal material including silver or a silver alloy.

(Filling step) The step of introducing the above powder of diamond, the above powder of the group 4 compound, and the above metal material into a die.

(Infiltration step) The step of heating the matters introduced in the die to composite together the above diamond and the above silver or silver alloy molten.

The method for producing the diamond composite material does not use an element of group 4 of the periodic table exactly as a raw material, as described in patent document 1; rather, the method uses as a raw material a powder of a group 4 compound including an element of group 4 of the periodic table and a particular element, more specifically, at least one type of element of sulfur, nitrogen, hydrogen and boron. The powder of the group 4 compound can suppress oxidation of the element of group 4 of the periodic table in a stage as a raw material, the preparation step, and the filling step, etc. The suppression of oxidation helps the environment around the element of group 4 of the periodic table to be in a state having little oxygen, and in the infiltration step, can suppress oxidation by otherwise surrounding oxygen of the element of group 4 of the periodic table generated in the chemolysis of the above group 4 compound.

Furthermore, the above particular element includes an element which presents a reducing action.

The reducing action as referred to herein is an action which, in the infiltration step while temperature is increased etc., can reduce oxygen and an oxide that may be included in raw materials such as industrial diamond and silver or a silver alloy, oxygen and an oxide that may be present around the element of group 4 of the periodic table generated by the chemolysis, etc., and thus remove them as a gas (e.g., water vapor).

The oxidation suppressing effect and reducing action that the above particular element has can effectively suppress oxidation of the above element of group 4 of the periodic table, as a matter of course, and diamond, silver, etc. in the production process.

Thus, the element of group 4 of the periodic table and the diamond can satisfactorily react, and a carbide which can enhance wettability between the diamond and a molten metal can be formed soundly and sufficiently neither excessively nor insufficiently. In particular, by using the powder of the group 4 compound as a source of a carbide forming element (an element of group 4 of the periodic table), the element of group 4 of the periodic table can be supplied in an amount having small or substantially no variation, and can thus be supplied stably, and the carbide layer hardly varies in thickness. That is, a carbide layer in which a constituent component (i.e., carbon) of the diamond particle and the element of group 4 of the periodic table are bonded together is easily formed on a surface of the diamond particle uniformly with a uniform thickness. Thus, according to the method for producing the diamond composite material, a composite material which has a small oxygen content and is dense and excellent in thermal conductivity (representatively, a diamond composite material according to an embodiment) can be produced.

(m2) As an example of the method for producing the diamond composite material, in the above filling step, a form in which a mixture powder including the above powder of diamond and the above powder of the group 4 compound, and the above metal material are introduced into a die in layers to provide the introduced matters in a stack of layers, is mentioned.

The above form allows the matters introduced into the die to be a mass (or layer) of the mixture powder and that of the metal material, and ensures helping the group 4 compound to present around the diamond. Accordingly, the above form further ensures that the element of group 4 of the periodic table and the diamond more easily react with each other and thus form a carbide, and easily suppress remaining of the element of group 4 of the periodic table which has not reacted with the diamond substantially, and furthermore, a presence of the element as an oxide. Furthermore, for example when a layer of the mixture powder and a layer of the metal material disposed thereon are provided to form a stack of layers, the metal material is collectively present in the layer of the metal material, and accordingly, the molten metal is also collectively provided and thus presents a large self-weight, and by its self-weight, can automatically and easily move to the side of the layer of the mixture powder and thus satisfactorily infiltrate thereinto. Furthermore, the molten metal easily infiltrates to the side of the layer of the mixture powder uniformly, and it is believed that, as compared with a case where a small amount of molten metal is dispersed and thus produced at each site, a diamond composite material in which a metal matrix is uniformly present is easily obtained. In addition, when the metal material is used in the form of a metal powder and mixed with the powder of diamond, with the metal powder larger in specific gravity than diamond, it can be said that the metal powder is not easily mixed with the powder of diamond uniformly. In contrast, the above form only requires mixing the powder of diamond with the above powder of the group 4 compound which has a relatively small difference in specific gravity from diamond, and is thus excellent in operability in mixing. Thus, according to the above form, a diamond composite material which is dense and has high thermal conductivity can be produced more productively.

(m3) As an example of the method for producing the diamond composite material, a form is mentioned in which in a case where the introduced matters described for the form of item (m2) are formed in a stack of layers, in the above filling step, the above metal material, the above mixture powder, and the above metal material are successively stacked to form a stack of layers having opposite sides of metal.

The above form can produce a coated composite material in which the diamond composite material has opposite sides each with a metal layer thereon which is composed of a metal of the same composition as the metal matrix. In particular, the above form can also form the metal layer simultaneously with infiltration, and as compared with a case where the metal layer is formed in a separated step such as bonding a metal foil etc., the above form allows fewer steps and can produce the coated composite material productively. The obtained coated composite material has a structure where the metal matrix and the metal layer are immediately adjacent, and hence has a large bonding strength and prevents the metal layer from easily peeling off, and is also excellent in thermal conductivity. Other than this, this form can provide a variety of effects set forth in item (m2) above.

(m4) As an example of the method for producing the diamond composite material, a form is mentioned in which the above metal material is a metal powder and a layer of the above metal powder includes at least one of a powder of a group 4 compound including an element of group 4 of the periodic table and a powder of the element of group 4 of the periodic table.

In the above form in which the layer of the metal material is a layer which includes a metal powder and in addition a powder of a group 4 compound and/or a powder of an element of group 4 of the periodic table, the element of group 4 of the periodic table generated as the group 4 compound included in the layer of the metal powder is chemically decomposed and/or the element of group 4 of the periodic table included in the layer of the metal powder is/are initially taken into the molten metal produced as the metal powder is molten in the infiltration step while temperature is increased, and subsequently react/reacts with diamond to form a carbide. Once the reaction of the diamond has started, subsequently, such a reaction easily, continuously occurs. That is, the above form provides a state where the element of group 4 of the periodic table is easily taken into the molten metal infiltrating into the diamond, and as a result, it can be said to facilitate a reaction between the diamond and the element of group 4 of the periodic table, and can produce a carbide more satisfactorily. Thus, according to the above form, a diamond composite material which is denser and has higher thermal conductivity can be produced.

DETAILED DESCRIPTION OF EMBODIMENTS OF THE PRESENT INVENTION

Figure 4:
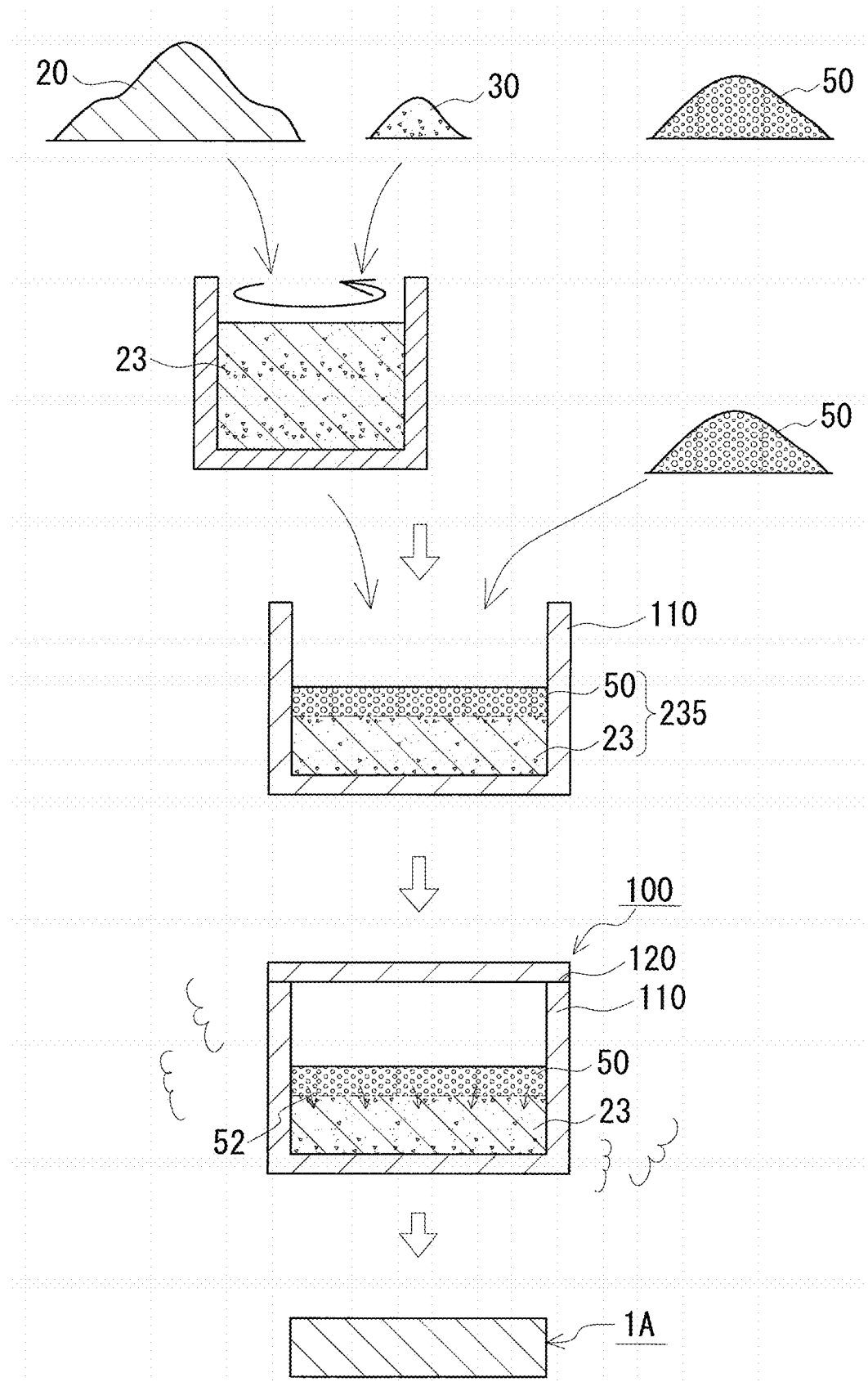
FIG. 4 is a diagram for illustrating a process, showing an example of a procedure of a method for producing a diamond composite material according to an embodiment.
Figure 5:
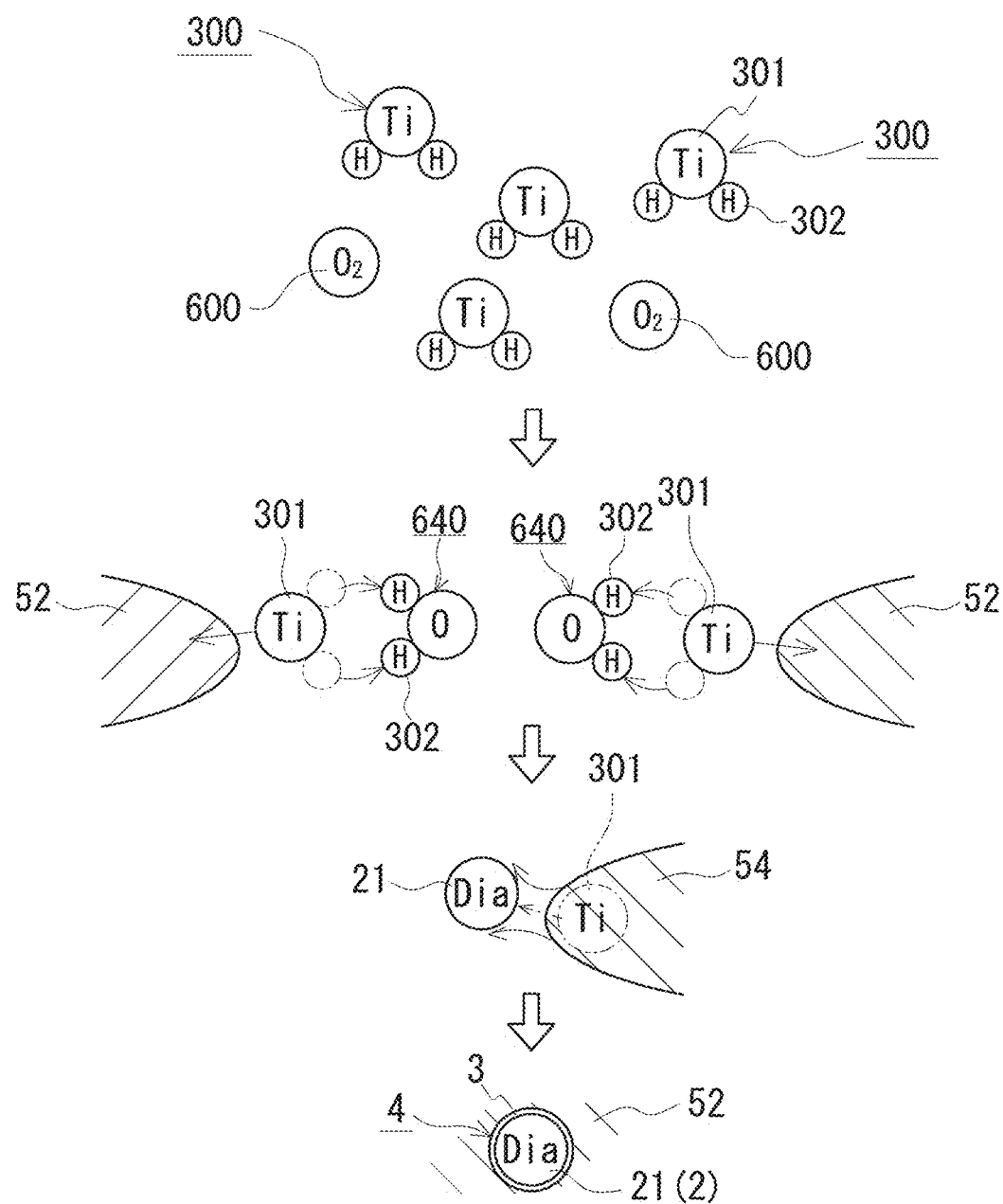
FIG. 5 schematically illustrates a phenomenon caused in an infiltration step in the method of producing a diamond composite material according to an embodiment.
Figure 6:
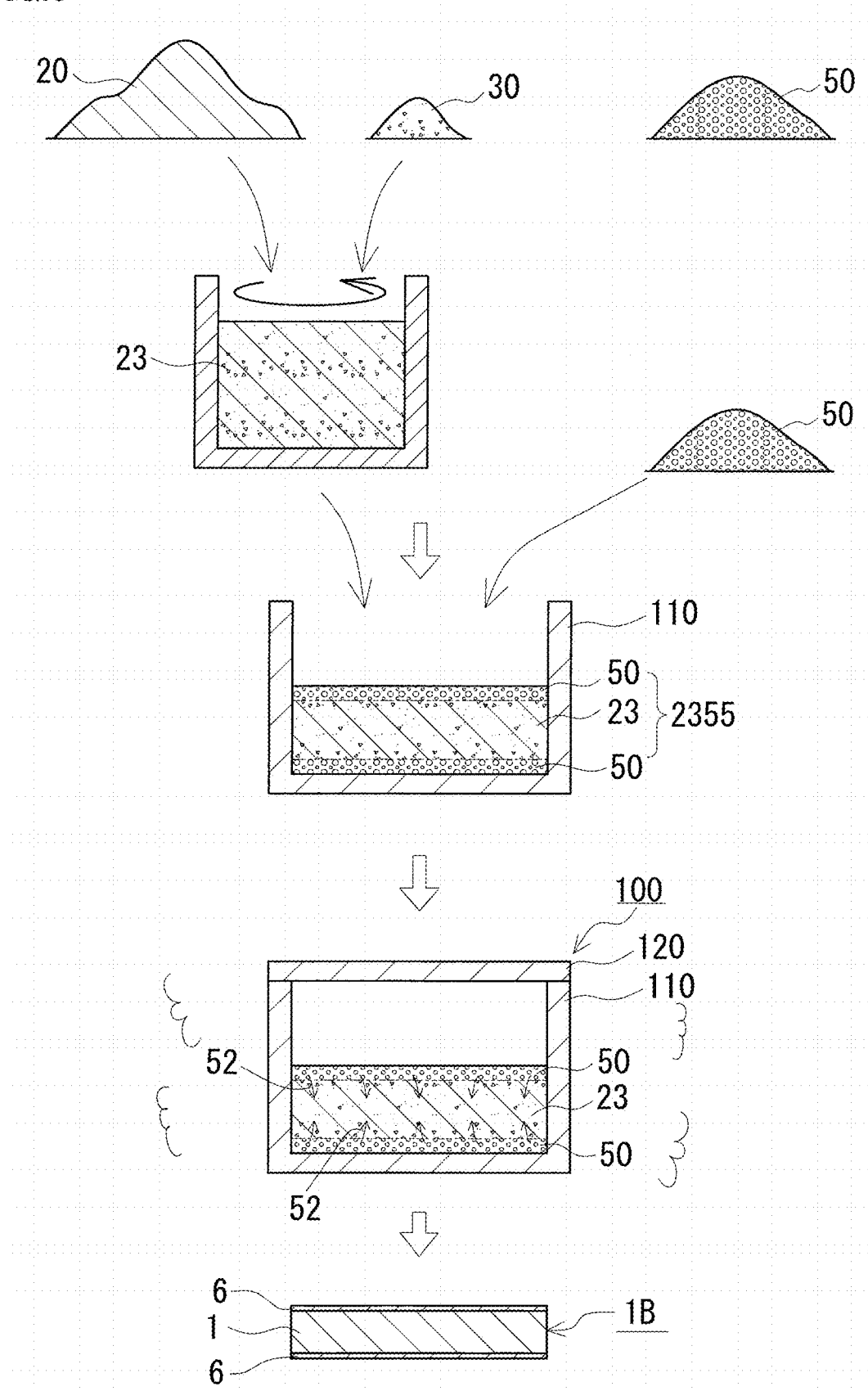
FIG. 6 is a diagram for illustrating a process, showing an example of a procedure of a method for producing a diamond composite material according to an embodiment (a method to form a metal layer on opposite sides).

Hereafter, with reference to FIG. 1, a diamond composite material and a heat radiating member according to an embodiment of the present invention will specifically be described, and with reference to FIG. 4 to FIG. 6, a method for producing a diamond composite material which can produce the diamond composite material of the embodiment will specifically be described.

Diamond Composite Material

A diamond composite material 1 according to an embodiment comprises, as shown in FIG. 1, a plurality of coated diamond particles 4 including a diamond particle 2 and a carbide layer 3 covering a surface of diamond particle 2 and including an element of group 4 of the periodic table, and a metal matrix 5 binding coated diamond particles 4 together. A gap which the plurality of coated diamond particles 4 form is filled with metal matrix 5 and diamond particles 2 are thus maintained by metal matrix 5 in a collected state. Composite material 1 is a dense compact having significantly few voids and filled with metal matrix 5 without a gap (see a backscattered electron image via an EPMA shown in FIG. 2). Composite material 1 of the embodiment is characterized by having a small oxygen content throughout its entirety. Hereafter, the composite material will specifically be described for each constituent element.

Coated Diamond Particle

Diamond

Diamond composite material 1 includes a plurality of diamond particles 2 as one major constituent element. Composite material 1 having a larger content of diamond particle 2 is excellent in thermal conductivity and thus preferable. For example, composite material 1 can have a thermal conductivity satisfying 500 W/m·K or more. In contrast, not having the above content too excessively and instead including metal matrix 5 to some extent can prevent composite material 1 from having an excessively small coefficient of thermal expansion. For example composite material 1 can have a coefficient of thermal expansion about $4 \times 10^{-6}$/K or more and about $9.5 \times 10^{-6}$/K or less, which is close to the coefficient of thermal expansion of a semiconductor element or its peripheral component. Furthermore, when the above content is not excessively large, then the composite material can be produced such that a molten metal can sufficiently infiltrate into gaps formed between the diamond particles. As a result, densification and compositing via carbide layer 3 can be performed satisfactorily to allow composite material 1 to be denser. When thermal conductivity, consistency in coefficient of thermal expansion with a semiconductor element etc., densification, etc. are taken into consideration, The content of diamond particles 2 in composite material 1 is preferably 30 volume % or more and 90 volume % or less, more preferably 45 volume % or more and 85 volume % or less, 50 volume % or more and 80 volume % or less. The method of measurement of the content of diamond particle 2 in composite material 1 will be described later.

Diamond composite material 1 including diamond particles 2 having a larger particle diameter has fewer diamond powder particle boundaries therein and is hence excellent in thermal conductivity, which is preferable. For example, composite material 1 can have a thermal conductivity satisfying 500 W/m·K or more. In contrast, when the above particle diameter is not excessively large, the diamond composite material is excellent in workability such as grinding and is thus adjustable to satisfy a prescribed dimensional tolerance. Furthermore, when the above particle diameter is not excessively large, composite material 1 can be thin. When thermal conductivity, workability, reduction in thickness, etc. are taken into consideration, diamond particles 2 in composite material 1 preferably have an average particle diameter of 1 μm or more and 300 μm or less, more preferably 1 μm or more and 100 μm or less, 20 μm or more and 60 μm or less. The diamond powder can also be a mixture of fine diamond powder and coarse diamond powder. Composite material 1 including the mixture of fine diamond powder and coarse diamond powder is denser and has a higher relative density. The method of measurement of the average particle diameter of diamond particles 2 in composite material 1 will be described later.

Carbide Layer

Each diamond particle 2 in diamond composite material 1 has a surface covered with a carbide including an element of group 4 of the periodic table, and each coated diamond particle 4 includes carbide layer 3 formed of the above carbide. This carbide layer 3 closely adheres to both diamond particle 2 and metal matrix 5 (see the backscattered electron image via the EPMA shown in FIG. 2). As has been described above, composite material 1 has a significantly small oxygen content, and there is no oxide substantially present therein so that it is believed that in its production process carbide layer 3 is easily formed on a surface of diamond soundly, and carbide layer 3 is excellent in wettability with a molten metal, which mainly serves as metal matrix 5 in composite material 1, and the close adhesion is thus achieved. Composite material 1 including such a carbide layer 3 has three elements, i.e., diamond particle 2, carbide layer 3, and metal matrix 5, closely adhering without a gap, and is thus dense.

Carbide layer 3 can be formed in a variety of methods that do not impair the gist of the present invention. From a viewpoint of further enhancing close adhesion with diamond particle 2, it is preferable that carbide layer 3 be composed of a carbide which is formed by bonding a constituent element of a region of diamond particle 2 closer to a surface thereof (i.e., carbon) and an element of group 4 of the periodic table together. In that case, carbide layer 3 has as a constituent element thereof a component of diamond particle 2 per se, and can hence excellently adhere to diamond particle 2 to allow composite material 1 to be denser.

Major constituent components of carbide layer 3 are carbon, preferably carbon derived from diamond particle 2, and an element of group 4 of the periodic table. As the element of group 4 of the periodic table included in carbide layer 3, at least one type selected from titanium (Ti), zirconium (Zr), and hafnium (Hf) is mentioned. Carbide layer 3 can be a form including only one type of the enumerated elements or a form including two or more types thereof.

When carbide layer 3 is excessively thick, it provides a carbide excessively, which easily invites reduction in thermal conductivity, and accordingly, when thermal conductivity is considered, it is preferable that the carbide layer be thin to some extent. Specifically, carbide layer 3 preferably has an average thickness of 5 μm or less, 3 μm or less, and less than 3 μm, more preferably 1 μm or less, and can also have it in nano order. When carbide layer 3 is a reaction product produced when diamond composite material 1 is produced, the thickness of carbide layer 3 can be adjusted representatively by adjusting an amount of a raw material added, its size, etc.

Preferably, any of diamond particles 2 in diamond composite material 1 is coated diamond particle 4. When each coated diamond particle 4 has diamond particle 2 having a surface area coated by 90 area % or more with the above carbide, and furthermore, having the diamond's surface entirely coated therewith, composite material 1 is densified, which is preferable. When a region of diamond particle 2 closer to a surface thereof substantially entirely exists as a carbide, composite material 1 is further densified, which is preferable. Note that although including at a surface of diamond a portion in which a carbide including an element of group 4 of the periodic table is absent is permitted, the smaller this portion is, the more preferable.

Diamond composite material 1 can have a portion in which at least a portion of carbide layer 3 included in coated diamond particle 4 is coupled and thus integrated with at least a portion of carbide layer 3 included in coated diamond particle 4 immediately adjacent thereto (hereinafter this portion may also be referred to as a coupling portion). A form which has the coupling portion composed of a carbide and a form which does not have the coupling portion (a form having coated diamond particles dispersed separately, so to speak) are both dense and have an excellent thermal property.

Metal Matrix

Diamond composite material 1 includes metal matrix 5 as one major constituent element. Let a constituent component of metal matrix 5 be silver (so-called pure silver) or a silver alloy. Metal matrix 5 of silver allows a thermal conductivity as high as 427 W/m·K, and composite material 1 can be excellent in thermal conductivity. The silver alloy is an alloy which contains more than 50 mass % of Ag and an additive element, with a balance composed of an inevitable impurity. In particular, a silver alloy which contains 70 mass % or more of Ag and an additive element with a balance composed of an inevitable impurity has a tendency to have a low liquidus point temperature while maintaining high thermal conductivity, and is excellent in productivity as it allows satisfactory compositing when the composite material is produced with a low infiltration temperature. As the additive element of the silver alloy, Cu etc. are mentioned. As a total content of the additive element, about 30 mass % or less is mentioned.

Oxygen Concentration

Diamond composite material 1 is characterized by having little oxygen throughout its entirety. Specifically, the oxygen content of composite material 1 is 0.1 mass % or less. When the oxygen content of the composite material 1 throughout its entirety is 0.1 mass % or less, there are a sufficiently small amount of an oxide, satisfactorily few voids, etc., preferably substantially no oxide or void, present in a vicinity of a portion of diamond particle 2 closer to a surface thereof. Accordingly, composite material 1 can suppress a reduction in thermal conductivity between diamond particle 2 and metal matrix 5 attributed to an oxide etc. otherwise interposed, and is thus excellent in thermal conductivity. Furthermore, when there is little oxide, it can be said that the element of group 4 of the periodic table exists as a carbide rather than an oxide, and composite material 1 can be densified via carbide layer 3. The smaller the above oxygen content is, the better, and 0.095 mass % or less, 0.090 mass % or less, and 0.080 mass % or less are more preferable.

Diamond particle 2 in diamond composite material 1 preferably has a surface at which, except for metal matrix 5, only carbide layer 3 is present. That is, preferably, when an elemental analysis is performed in a vicinity of a portion of diamond particle 2 closer to a surface thereof, carbon and an element of group 4 of the periodic table are mainly present, and there are few other elements, little oxygen in particular. When oxygen is present in a vicinity of a portion of diamond particle 2 closer to a surface thereof, it is believed that this oxygen is present as an oxide of the element of group 4 of the periodic table, etc., for example. This oxide has a low thermal conductivity and also has poor wettability with a molten metal, and if it is present in a vicinity of a portion of diamond particle 2 closer to a surface thereof the composite material can be inferior in thermal conductivity and denseness. Composite material 1 of an embodiment has a low total oxygen concentration, and hence a sufficiently low oxygen concentration in a vicinity of a portion of diamond particle 2 closer to a surface thereof. An example of composite material 1 of an embodiment is a composite material in which when a boundary of diamond particle 2 and carbide layer 3 is taken and from that boundary toward an outer peripheral side (or toward metal matrix 5) a loop region is taken up to a thickness of 5 μm, and this loop region is set as an outer peripheral region, then the outer peripheral region has an oxygen content satisfying 0.1 mass % or less. The above boundary can be easily visualized by utilizing an EPMA elemental mapping described later. Furthermore, when the EPMA elemental mapping is utilized, it can be easily confirmed that composite material 1 of the embodiment has significantly little oxygen, preferably substantially no oxygen, in a vicinity of a boundary of diamond particle 2 and carbide layer 3.

It is believed that sources of oxygen which can be included in diamond composite material 1 are a powder 20 of diamond of a raw material (see FIG. 4), a metal material of silver, a silver alloy, etc. (in FIG. 4, a metal powder 50), an atmosphere in the production process, etc. As such, oxygen may be included in any portion of composite material 1. It is assumed that in composite material 1 the oxygen concentration in its entirety is set as a particular range and when the entirety's oxygen is little, a vicinity of a boundary of the diamond and a substance adjacent to the diamond, i.e., a portion which easily invites degradation in thermal conductivity, also has significantly little oxygen. By utilizing a method for producing the diamond composite material described later, composite material 1 can be produced which allows oxygen to be satisfactorily reduced/removed in the production process and thus has a low oxygen concentration throughout its entirety, including a vicinity of diamond particle 2.

Metal Layer

An example of diamond composite material 1 can be a form including a metal layer 6 which covers at least a portion of a surface of composite material 1, as shown in FIG. 6 (note that a coated composite material 1B of FIG. 6 is one example). When composite material 1 and a semiconductor element etc. are bonded using solder, a brazing material, etc., using coated composite material 1B including metal layer 6 allows metal layer 6 and a metal such as solder and the brazing material to sufficiently get wet and coated composite material 1B etc. and the semiconductor element etc. are strongly bonded together, which is preferable.

Metal layer 6 may be composed of a metal which can endure a temperature at which solder, the brazing material, etc. are used, and is thus not limited in particular. Metal layer 6 can for example assume any of a form which has any component identical to that of metal matrix 5, a form which has a major component identical to that of metal matrix 5, (for example, a form in which metal matrix 5 and metal layer 6 are both a silver alloy and an additive element is different, a form in which metal matrix 5 is silver and metal layer 6 is a silver alloy, etc.), and a form in which metal matrix 5 and metal layer 6 have completely different components. When metal layer 6 is different from a metal constituting metal matrix 5, then, as a specific metal, copper, gold, aluminum, nickel, zinc, tin, an alloy of each element, etc. are mentioned. Metal layer 6 can be a monolayer structure as well as a multilayer structure. Metal layer 6 may be formed in any method, as will be described later.

For the purpose of suppressing reduction in thermal conductivity throughout the coated composite material, it is preferable that metal layer 6 be thinner. Specifically, for a thickness of metal layer 6, (a total thickness in the case of the multilayer structure), 300 μm or less, 200 μm or less, and 100 μm or less are mentioned. In contrast, for the purpose of using it as an underlying material for bonding, as described above, as a thickness of metal layer 6, 0.5 μm or more, 5 μm or more, and 20 μm or more are mentioned. For some application or the like of diamond composite material 1, metal layer 6 may be dispensed with, or it may have a thickness less than 0.5 μm.

Property

Thermal Property

Diamond composite material 1, coated composite material 1B, etc. of the embodiment are excellent in thermal conductivity. For example, composite material 1 described above has a thermal conductivity satisfying 500 W/m·K or more at room temperature (a thermal conductivity in a state where metal layer 6 is included in the case of the coated composite material). The higher the thermal conductivity is, the more excellent composite material 1 is in thermal conductivity, and it is thus preferable as a material for a heat radiating member, and accordingly, 520 W/m·K or more, 550 W/m·K or more, and 600 W/m·K or more are more preferable.

Diamond composite material 1, coated composite material 1B, etc. of an embodiment have diamond particle 2 having a small coefficient of thermal expansion and metal matrix 5 having a sufficiently larger coefficient of thermal expansion than diamond as a main body, and thus have a coefficient of thermal expansion assuming a value intermediate between the two coefficients of thermal expansion. For example, composite material 1 as above etc. has a coefficient of thermal expansion, as averaged, of $3 \times 10^{-6}$/K or more and $13 \times 10^{-6}$/K or less at 30° C. to 150° C. (a coefficient of thermal expansion in a state where metal layer 6 is included in the case of the coated composite material). Although also depending on the content of diamond particle 2, the component(s) of metal matrix 5, etc., the composite material can be such that the above coefficient of thermal expansion satisfies $4 \times 10^{-6}$/K or more and $12 \times 10^{-6}$/K or less, $4.5 \times 10^{-6}$/K or more and $10 \times 10^{-6}$/K or less.

Diamond composite material 1, coated composite material 1B, etc. that have a thermal conductivity satisfying 500 W/m·K or more at room temperature and have a coefficient of thermal expansion, as averaged, satisfying $3 \times 10^{-6}$/K or more and $13 \times 10^{-6}$/K or less at 30° C. to 150° C., are excellent in thermal conductivity and also excellent in consistency with the coefficient of thermal expansion of a semiconductor element or its peripheral components, and can be suitably used as a heat radiating member of the semiconductor element.

Diamond composite material 1, coated composite material 1B, etc. of an embodiment, are excellent in thermal conductivity and in addition, even when they undergo a cold and hot cycle or are heated to high temperature, they have small reduction in thermal conductivity and can thus maintain high thermal conductivity (a thermal conductivity in a state where metal layer 6 is included in the case of the coated composite material).

As one example, composite material 1 having a cold and hot cycle endurance of 95% or more at −60° C. to +250° C. is mentioned. When such composite material 1 undergoes a cold and hot cycle, it has as small a reduction in thermal conductivity as 5% or less, and can suitably be used as a material for a heat radiating member of a semiconductor element undergoing the cold and hot cycle in use.

Or as one example, composite material 1 etc. having a thermal conductivity degradation rate less than 5% after it is heated to 800° C. is mentioned. Note that when composite material 1 etc. is applied to a heat radiating member of a semiconductor element, the heat radiating member and an insulating material etc. composed of ceramics etc. may be bonded together. In this bonding, a bonding material of a high melting point such as a silver brazing material may be used. In that case, the heat radiating member will be heated by the bonding material, and it is desired that the heat radiating member have little reduction in thermal conductivity by this heating. When composite material 1 having a thermal conductivity degradation rate less than 5%, as described above, is exposed to high temperature, it has little reduction in thermal conductivity and it can be said to be excellent in heat resistance. This composite material 1 etc. can suitably be applied to a heat radiating member of a semiconductor element to which silver solder or a similar bonding material may be applied.

Relative Density

Diamond composite material 1, a region of composite material 1 in coated composite material 1B, etc. of the embodiment have few voids and are dense, and have a high relative density. Metal layer 6 of coated composite material 1B has substantially no void and is thus dense, and accordingly, coated composite material 1B has a high relative density even in a state where metal layer 6 is included. For example, composite material 1, etc. as above has a relative density satisfying 96.5% or more. The higher the composite material is in relative density, the denser it is, and it less easily has reduction in thermal conductivity resulting from voids and thus has high thermal conductivity, and accordingly, 96.7% or more, 97.0% or more, and 97.5% or more are more preferable Shape and Size As a representative shape of diamond composite material 1, coated composite material 1B, etc. of an embodiment, a flat plate is mentioned. Depending on a shape of a die used, cutting, etc. when it is produced, composite material 1 etc. can be formed to have a flat planar shape, a three-dimensional shape, etc. as desired. The size (thickness, width, length, etc.) of composite material 1 etc. can be selected as appropriate. Small thickness (e.g., 5 mm or less, 3 mm or less, and furthermore, 2.5 mm or less) allows composite material 1 etc. to be lightweight and thin.

Heat Radiating Member

A heat radiating member according to an embodiment is composed of diamond composite material 1, coated composite material 1B, etc. of an embodiment to substantially maintain a composition, a structure, a property, etc. of composite material 1 etc. Accordingly, the heat radiating member of the embodiment has a small oxygen content (see the section of "oxygen concentration" above), is dense (see the section of "relative density" above) and is excellent in thermal conductivity (see the section of "thermal property" above), and can thus be suitably used as a heat radiating member of a semiconductor element.

Method for Producing the Diamond Composite Material

Diamond composite material 1, coated composite material 1B, etc. according to an embodiment can be produced in the following method for producing a diamond composite material, for example. This production method is outlined as follows: as shown in FIG. 4 and FIG. 6, a raw material including powder 20 of diamond and a metal material (in FIG. 4 and FIG. 6, metal powder 50) which finally forms metal matrix 5 (see FIG. 1) is prepared (i.e., a preparation step) and introduced into a container 110 of die 100 (i.e., a filling step), and the introduced matters are heated to melt the metal material to infiltrate molten metal 52 into powder 20 of diamond (i.e., an infiltration step). Furthermore, in this production method, as a raw material, a powder 30 of a group 4 compound including an element of group 4 of the periodic table and a particular element is used to effectively suppress oxidation until the element of group 4 of the periodic table forms a carbide, and in the infiltration step while temperature is increased the group 4 compound is chemically decomposed and the particular element other than group 4 of the periodic table generated through this chemolysis is caused to exhibit a reducing action etc. to reduce/remove oxygen which may be present around the diamond, while the element of group 4 of the periodic table generated through the chemolysis and the diamond are caused to react with each other to form a carbide. Hereinafter, each step will be described.

Preparation Step

In this step, powder 20 of diamond, powder 30 of a group 4 compound including an element of group 4 of the periodic table, a metal material including silver or a silver alloy are prepared as a raw material.

Powder of Diamond

Powder 20 of diamond has a size (an average particle diameter) and a content (a volume ratio occupying the raw material) selected such that a diamond composite material 1A finally produced has diamond particles having a size (an average particle diameter) and a content (a volume ratio occupying composite material 1A) having desired values (see the section of "diamond" above). In this method for producing the diamond composite material, a region of each powder particle configuring powder 20 of diamond that is closer to a surface of the particle is used in forming carbide layer 3 (see FIG. 1), and accordingly, strictly speaking, the size and content of the diamond in the stage as a raw material is different from the size and content of the diamond in composite material 1A. However, carbide layer 3 is significantly thin, as described above, and it can be said that the size, content, shape, etc. of the diamond in composite material 1A substantially maintain the size, content, shape, etc. in the stage as a raw material. The diamond powder of the raw material preferably has an average particle diameter of 1 μm or more and 300 μm or less, and furthermore, 1 μm or more and 100 μm or less, 20 μm or more and 60 μm or less, as has been discussed above. When the diamond powder is a mixture of a fine powder and a coarse powder, the average particle diameter of the coarse particle is preferably twice or more, furthermore, thrice or more, quadruple or more of the fine particle, and when thermal conductivity, workability, etc. are taken into consideration, 300 μm or less and furthermore, 100 μm or less, 60 μm or less are preferable. The average particle diameter of the fine particle is only required to be smaller than the average particle diameter of the coarse particle, however, when densification etc. are taken into consideration, 1 μm or more, and furthermore, 5 μm or more, and 10 μm or more are preferable.

The higher powder 20 of diamond of the raw material is in purity (e.g., natural diamond), the more excellent it is in thermal conductivity, which is preferable. In contrast, industrial diamond is relatively inexpensive and easily available although it is low in purity. This method for producing the diamond composite material can use even industrial diamond as a raw material. This is because when powder 30 of a group 4 compound used as a raw material is caused to function as a reductant in the production process, an oxide which may adhere to surfaces of powder particles of diamond as an impurity can be reduced/removed.

Metal Material

The metal material has a constituent component selected to allow diamond composite material 1A finally produced to have metal matrix 5 therein having a desired composition (see the section of "metal matrix" above).

The metal material can be of a variety of forms, and for example metal powder 50 is mentioned. When metal powder 50 is heated in the infiltration step it has its individual powder particles easily molten and thus easily provides molten metal 52. Furthermore, metal powder 50 can be easily mixed with powder 20 of diamond, powder 30 of a group 4 compound, a powder of an element of group 4 of the periodic table described later, etc., and the mixture of the powders can be introduced into die 100. The size (average particle diameter) of metal powder 50 can be selected as appropriate, and a size of about 1 μm or more and about 150 μm or less is mentioned for example. In this range, it is believed that metal powder 50 is not excessively small and is thus easily handled, and is not excessively large and is thus easily molten.

As another metal material, a plate material, a block body, etc. can be used. In that case, it is recommended to size and shape it as appropriate to allow it to be introduced into die 100. Depending on the size, the plate material and the block body are easily accommodated in die 100 and excellent in operability.

The content (or volume ratio) of the metal material is selected such that the content (or volume ratio) of metal matrix 5 in diamond composite material 1A finally produced has a desired value.

Powder of Group 4 Compound

The powder of the group 4 compound including an element of group 4 of the periodic table has a constituent component selected to allow diamond composite material 1A finally produced to have carbide layer 3 therein including a desired element of group 4 of the periodic table (see the section of "carbide layer" above). More specifically, powder 30 of the group 4 compound includes one type of compound selected from a sulfide, a nitride, a hydride and a boride including one or more types of elements selected from Ti, Zr and Hf. Powder 30 can be a form including only one type of the enumerated compounds or a plurality thereof. In the latter case, for example, a composite material including coated diamond particles including TiC and coated diamond particles including ZrC, a composite material including coated diamond particles covered with a composite carbide layer including Ti and Zr, etc. can be produced. Of hydrides, $TiH_2$ is relatively easily obtained, and is also easily stored and thus excellent in handlability, and is thus easily used.

Of the group 4 compound, a component present in a final product, or diamond composite material 1A, is substantially only an element of group 4 of the periodic table, and this element mainly forms a carbide and is present as carbide layer 3 (see FIG. 1). Accordingly, the thickness of carbide layer 3 varies with the amount of powder 30 of the group 4 compound added. As has been discussed above, when carbide layer 3 is excessively thick, it provides a carbide excessively, which causes reduction in thermal conductivity, and accordingly, when thermal conductivity is considered, it is preferable that carbide layer 3 be not excessively thick. It is recommended to adjust the content (or volume ratio) of powder 30 of the group 4 compound so that the thickness of carbide layer 3 have a desired value.

Although powder 30 of the group 4 compound includes an element of group 4 of the periodic table which is relatively easily oxidizable, it is different from a simple substance of the element of group 4 of the periodic table, i.e., until it is heated in the infiltration step described later, the element of group 4 of the periodic table is bonded with sulfur (S), nitrogen (N), hydrogen (H), or boron (B). Accordingly, in this method for producing the diamond composite material, in a process for producing the composite material, the element of group 4 of the periodic table is not easily oxidized and a reaction of the element of group 4 of the periodic table and carbon (herein, a region of the diamond closer to a surface thereof, in particular) can be performed satisfactorily. Furthermore, each above element bonded to the element of group 4 of the periodic table can be removed as gas (e.g., water, nitrogen monoxide, sulfur dioxide, etc.). When each above element bonds with (or reduces) oxygen present around the diamond, an oxygen atom of an oxide, etc., oxygen reduction and removal can be performed more effectively.

Filling Step

In this step, powder 20 of diamond, powder 30 of the group 4 compound, and the metal material are introduced into container 110 of die 100. As a filling form are mentioned for example a form in which the three materials are introduced in layers and the introduced matters are thus provided as a stack of layers in a three-layer structure, a form in which when the three materials are all powders they are mixed together and thus introduced in the form of a mixture of all of the powders, a form in which a powder of a mixture of two of the three materials and the remaining one material, which may not be powder, are introduced in layers and the introduced matters are thus provided as a stack of layers in a two-layer structure, etc.

In the case of the stack of layers in the two-layer structure, for example, a mixture powder 23 including powder 20 of diamond and powder 30 of a group 4 compound, and the metal material are disposed in container 110 of die 100 in layers to form a stack of layers 235. In that case, for reasons such as (i) that the group 4 compound can more reliably be present around the diamond, (ii) that molten metal is easily produced from the layer of the metal material, and the molten metal, which has a relatively large self-weight, is easily infiltrated toward the layer of mixture powder 23, (iii) that the molten metal is easily infiltrated uniformly, etc., it is expected that diamond composite material 1A which is dense and has high thermal conductivity is easily produced. Other than this, powder 20 of diamond and powder 30 of a group 4 compound are easily mixed together and mixture powder 23 can be satisfactorily prepared.

Mixture powder 23 can be prepared by using a mixer which can be used for mixing a powder of a nonmetallic inorganic material (herein, powder 20 of diamond and powder 30 of a group 4 compound), as appropriate. For example, known devices, such as a Henschel mixer and a vacuum mixer, can be used. Any of wet blending using a liquid binder represented by polyvinyl alcohol or a similar organic matter, water, alcohol, etc, and dry blending which does not use a binder can be employed. In the wet blending, after mixing or after mixture powder 23 is introduced into die 100, a drying step which removes the binder may be performed, however, the binder may be removed by heating in the infiltration step. Other than this, when water, alcohol, etc. are used in the wet blending, then, heating, vacuum drying, etc. performed in the blending, as appropriate, to gradually remove water, alcohol, etc. suppress separation of the diamond and the group 4 compound, etc. resulting from a difference in specific gravity etc., and thus facilitate uniform blending.

By introducing mixture powder 23 thus prepared into container 110, and introducing thereon a metal material such as metal powder 50, stack of layers 235 of a two-layer structure can be formed. When the metal material with a large specific gravity is disposed on the layer of mixture powder 23, and the metal material melts in a subsequent step, then by the metal's self-weight, molten metal 52 moves to the side of the underlying layer of mixture powder 23 easily and can thus infiltrate thereinto. As will be described later, a chemical combination reaction of the element of group 4 of the periodic table included in molten metal 52 and the diamond allows the infiltration to proceed. When forming stack of layers 235, a desired filling density is achieved for example by: pressing powders 23 and 50 with a pressure, which may be a small pressure of a degree such as pressing by hand, whenever each powder is introduced; applying vibration thereto and tapping them; etc. Once stack of layers 235 has been formed, a lid 120 of container 110 is closed.

As die 100, a die can be used which includes container 110 in the form of a box, a bottomed cylinder, etc., and lid 120 which closes an opening of container 110. It is recommended to select the shape of container 110 so that diamond composite material 1A of a desired shape can be molded. As die 100, a die can suitably be used which is excellent in heat resistance, strength, etc., such as formed of carbon. When die 100 has lid 120, lid 120 can prevent an atmospheric gas from excessively entering container 110.

Infiltration Step

This step heats a matter that is introduced into die 100 (stack of layers 235 as one example) to composite the diamond and the metal material molten or molten metal 52 together.

The heating temperature is equal to or greater than a temperature at which the metal material melts, i.e., silver's melting point (961° C.) or more, or the silver alloy's liquidus temperature or more. For example the heating temperature is 980° C. or more and 1300° C. or less. The retention time is for example about 10 minutes or more and about 3 hours less.

The atmosphere is preferably a non-oxidizing atmosphere (e.g., an atmosphere of argon) or a low-oxidizing atmosphere (e.g., a vacuum atmosphere, with a degree of vacuum of 10 kPa or less) in order to prevent oxygen from being mixed/increased. An atmosphere with lower pressure facilitates infiltration, and a decompressed atmosphere less than the atmospheric pressure is preferred (for example 10 kPa or less).

A phenomenon believed to be caused in the infiltration step will be described with reference to FIG. 5 by referring as an example to a case utilizing stack of layers 235. In FIG. 5, as a group 4 compound 300, of hydrides, $TiH_2$ is indicated as an example. Temperature is increased and once a temperature of about 200° C. to 300° C. has been reached, the metal powder discharges oxygen 600 which may be contained therein and oxygen 600 may be contained in the layer of the mixture powder (see FIG. 5, upper stage). Temperature is further increased and once a temperature of about 500° C. to 600° C. has been reached, group 4 compound 300 is chemically decomposed into an element 301 of group 4 of the periodic table (in FIG. 5, Ti) and an element 302 other than the element of group 4 of the periodic table (in FIG. 5, hydrogen (H)) (see FIG. 5, middle stage). Particular element 302 generated by the chemolysis bonds with oxygen 600, an oxygen atom of an oxide present on a surface of a raw material, etc. to form a gaseous compound 640 (in FIG. 5, water vapor (water)), and is thus discharged from the mixture powder. Thus, particular element 302 can effectively reduce or remove the oxygen which may be included in the raw material etc.

When temperature is further increased the metal material molten or molten metal 52 enters the side of the layer of the mixture powder and takes in element 301 of group 4 of the periodic table generated by the above described chemolysis. When a composite molten metal 54 having taken in element 301 of group 4 of the periodic table contacts a diamond particle 21 in the layer of the mixture powder (see FIG. 5, lower middle stage), the carbon of a region of diamond particle 21 closer to a surface thereof and element 301 of group 4 of the periodic table react (or bond together) to form a carbide. By the formation of the carbide, composite molten metal 54 easily gets wet with diamond particle 21, and throughout a region of diamond particle 21 closer to a surface thereof, the reaction to form the carbide with element 301 of group 4 of the periodic table continuously proceeds. Element 301 of group 4 of the periodic table in composite molten metal 54 is consumed as the reaction with diamond particle 21 proceeds, and becomes molten metal 52 of silver or the silver alloy. As the carbide is formed, infiltration of molten metal 52 etc. proceeds. As a result, coated diamond particle 4 comprising carbide layer 3 including the element of group 4 of the periodic table can be formed on a surface of diamond particle 2, and an infiltrated material can be formed in which a gap formed between these coated diamond particles 4 is filled with molten metal 52. Adjacent diamond particles 21s form carbides, respectively, and can thus form a portion at which the carbides are coupled together. In that case, a composite material which has a coupling portion composed of the carbide can be produced.

In the above described phenomenon, before diamond particle 21 and element 301 of group 4 of the periodic table react, when the above described particular element 302 generated by the chemolysis of group 4 compound 300 bonds with oxygen 600 which may be present around diamond particle 21, or reduces an oxide, oxygen 600 etc. can sufficiently be reduced or removed and the amount of oxygen in the diamond composite material finally obtained can be effectively reduced. Thus removing oxygen in a vicinity of a surface of diamond particle 21 allows diamond composite material 1A (1) to have a low oxygen concentration in a vicinity of diamond particle 21 (2). And since the oxygen has been removed as described above, element 301 of group 4 of the periodic table generated by the chemolysis of group 4 compound 300 easily reacts with diamond particle 21 to form the carbide. The element of group 4 of the periodic table included in powder 30 of the group 4 compound used as a raw material can have a major portion thereof, preferably be entirely, used to form the carbide. As a result, diamond particle 21 has a surface at least partially, preferably entirely, covered with the carbide to enhance wettability with molten metal 52(54). It is believed that such a phenomenon is similarly caused in any filling form described above.

To ensure a time for removing oxygen and forming a carbide, as described above, it is preferable to adjust a rate at which temperature is increased. For example, the temperature increasing rate is about 2° C./min or more and about 20° C./min or less.

After the above described infiltration, by cooling, diamond composite material 1A which has a low oxygen concentration and is dense and excellent in thermal conductivity is obtained. This method for producing the diamond composite material can thus utilize powder 30 of a group 4 compound including an element of group 4 of the periodic table to effectively achieve antioxidation of the element of group 4 of the periodic table, reduction of oxygen, an oxide, etc. and hence reduction and removal of oxygen and satisfactory formation of a carbide, and improvement of wettability of the diamond and the molten metal. Furthermore, this production method does not require performing a heat treatment a plurality of times in compositing diamond and silver or a silver alloy or performing high pressure press described in patent document 2, and can thus produce composite material 1A easily and is thus excellent in productivity.

Other Steps

Formation of Metal Layer

When coated composite material 1B etc. comprising metal layer 6 is produced, using a metal material, two methods, i.e., a simultaneous formation method which forms metal layer 6 simultaneously with compositing in the infiltration step, and a separate formation method which separately forms metal layer 6 on a surface of an infiltrated material produced through the infiltration step, can be employed.

In the simultaneous formation method, for example in forming stack of layers 235 of the two-layer structure described above, by adjusting (or increasing) the amount of the metal material, a coated composite material (a single-sided infiltrated material) can be formed which comprises, on one surface of a composite material, metal layer 6 which is identical in component to metal matrix 5 and also has a structure continuous therefrom. Alternatively, for example, in the filling step, as shown in FIG. 6, container 110 can be filled with a metal material such as metal powder 50 followed by mixture powder 23 followed by a last metal material such as metal powder 50 to form a stack of layers in a three-layer structure (a stack of layers with metal on opposite sides 2355). In this case also, by adjusting the amount of the metal material, when stack of layers with metal on opposite sides 2355 is heated, molten metal 52 on the lower side infiltrates into the layer of mixture powder 23 and accordingly, the layer of mixture powder 23 descends, while molten metal 52 on the upper side also infiltrates, and an intermediate portion is composited with the metal present above and below in a large amount. As a result, coated composite material 1B (a double-sided infiltrated material) comprising metal layer 6 on both a front surface and a back surface of composite material 1, as shown in FIG. 6, can be produced. Hereinafter, this method may be called a double-sided infiltration method.

The separate formation method can employ a variety of methods such as vapor deposition such as plating, sputtering, etc., immersion into molten metal, hot-pressing a metal plate, a metal foil, a metallic powder, etc. Preferably, before forming metal layer 6, the surface of diamond composite material 1 is cleaned.

When the hot press is performed, it is preferable that the pressure applied is about 0.2 ton/cm$^2$ or more and about 4.5 tons/cm$^2$ or less (about 19.6 MPa or more and about 441 MPa or less) and the heating temperature is about 300° C. or more and about 900° C. or less. In the hot press, by disposing a metal plate or the like on one surface of diamond composite material 1 and then pressing it, a one side-coated composite material can be produced. By disposing a pair of metal plates or the like to sandwich composite material 1 at opposite surfaces and then pressing it, coated composite material 1B having opposite surfaces with metal layer 6 thereon can be produced.

The separate formation method can easily form metal layer 6 identical in composition to metal matrix 5 of diamond composite material 1 as a matter of course, and metal layer 6 different in composition therefrom.

Polishing

Other than this, this method for producing the diamond composite material can comprise a grinding step to polish a surface of composite material 1A excluding metal layer 6 or a surface of coated composite material 1B including metal layer 6 etc.

[Exemplary Test 1]

A powder of diamond, a metal material, and a powder which includes an element of group 4 of the periodic table, as appropriate, were used to produce a diamond composite material, and its thermal property, relative density, and amount of oxygen were examined.

As a raw material were prepared a powder of diamond having an average particle diameter of 50 μm, a silver (Ag) powder as a metal material having an average particle diameter of 150 μm, and a powder α having an average particle diameter of 45 μm and including an element of group 4 of the periodic table that is of a material shown in table 1. As powder α, for samples Nos. 1-1 to 1-12 a powder of a group 4 compound was prepared, and for samples Nos. 1-102 to 1-104 a powder of an element of group 4 of the periodic table was prepared. Each powder's average particle diameter is a median particle size.

Each powder was adjusted in amount such that, for a volume having a diameter of 10 mmφ and a thickness of 2 mm, the powder of diamond was 60 volume %, the silver powder was 38 volume %, and powder α was 2 volume %. Sample No. 1-101 did not use powder α, and the powder of diamond was 60 volume % and the silver powder was 40 volume %.

In each sample which used powder α, the powder of diamond and powder α were wet-blended. Herein, a PVA solution (concentration: 0.2 mass %) with a solvent of water and ethanol and a solute of polyvinyl alcohol (PVA) was prepared, and the powders were immersed in this PVA solution and mixed together for 10 minutes using a vacuum mixing device (MAZERUSTAR produced by the Kurabo Industries, Ltd.). Subsequently, the mixture was mixed for 5 minutes while being vacuumed to dry and thus remove water and ethanol. A mixture powder including PVA was obtained by this step. PVA will be removed by heating in infiltration.

The above described mixture powder was introduced into a container of a die made of carbon. After the introduction, in order to level a surface of the mixture powder, a pressure of 40 kPa was applied to press the mixture powder, and thereafter, silver powder was introduced on the layer of the mixture powder to produce a powder compact of a two-layer structure (including a stack of layers) in the above container, and the container was closed with a lid. In this test, to help infiltration to proceed, on the powder compact a punch of carbon was placed and on the punch a weight was placed to apply a load (300 g), however, the weight may be omitted to perform natural infiltration. The die having incorporated therein the powder compact on which the above punch and weight were disposed was placed in an atmosphere of argon (Ar) (5 kPa) with the load of 300 g applied, and in that condition, the die was heated to 1200° C. at a temperature increasing rate of 10° C./min and once the die had reached 1200° C. it was held for 2 hours and a molten metal (molten silver in this example) was infiltrated into the diamond and thereafter the die was cooled to produce an infiltrated material (a disk having a diameter of 10 mmφ and a thickness of 2 mm). Each obtained sample's infiltrated material's thermal conductivity (W/m·K), coefficient of thermal expansion ($\times 10^{-6}$/K=ppm/K), relative density (%), cold and hot cycle endurance (%), and oxygen content (amount of oxygen, mass %) were measured. A result thereof is shown in table 1.

The thermal conductivity and the coefficient of thermal expansion were measured using a commercially available measuring instrument. The thermal conductivity was measured at a room temperature (23° C.). The coefficient of thermal expansion was an average value measured in a range of 30° C. to 150° C.

The relative density was calculated by (effective density/theoretical density)×100. The effective density was obtained using the Archimedes method (an underwater specific gravity method). The theoretical density was obtained from 100/{(mass % of diamond/density of diamond)+(mass % of metal matrix/density of metal matrix)+(mass % of element of group 4 of periodic table/density of element of group 4 of periodic table)}. The mass ratio of the diamond, the metal matrix (in this test, silver), and group 4 of the periodic table was calculated in this test by using the volume ratio of the raw material's composition. For example, in a sample using $TiH_2$ as the powder of the group 4 compound, the mass % of Ti was calculated from an amount of Ti resulting from decomposition into Ti and $H_2$. Other than this, the above mass ratio is obtained by utilizing various componential analyses for the composite material.

The cold and hot cycle endurance is an index representing how a substance is resistant to reduction in thermal conductivity as the substance varies in temperature, and it was obtained by (thermal conductivity after cold and hot cycle)/thermal conductivity before cold and hot cycle)×100. The thermal conductivity after the cold and hot cycle was measured as follows: each sample's infiltrated material was immersed in a test liquid held at −60° C. for 10 minutes, and thereafter immersed in a test liquid held at 250° C. for 10 minutes, and this operation was regarded as one cycle and this cycle was performed 1000 times and thereafter the thermal conductivity after the cold and hot cycle was measured. The thermal conductivity after the cold and hot cycle was measured at a room temperature (23° C.) using the above described commercially available measuring instrument. The test liquid can be Fluorine-based inert fluid ("Galden (registered trademark)", "Fluorinert (brand name)," etc.

The oxygen content was measured in this test with a test piece separately produced. Specifically, for each sample, a measuring material allowing five or more measuring test pieces of 3 mm×3 mm×5 mm to be obtained therefrom was produced similarly as each sample was produced. And the measuring material was subjected to wire electric discharge machining and thus had cut out thereof a plurality of measuring test pieces of 3 mm×3 mm×5 mm which were in turn washed with acid to remove a wire component. After having been washed with acid, each sample's measuring test pieces' oxygen concentration was measured using an oxygen and nitrogen analysis device (TC-600 type produced by LECO JAPAN CORPORATION). For each sample, an average value of the five measuring test pieces is shown in table 1. Points regarding the measurement of the oxygen content are also similar regarding an exemplary test described later. Note that the size of the measuring test piece is an example, and it can be changed to a measurable size, as appropriate, depending on the specification of the measurement device. The measuring test piece may be obtained from the composite material per se.

Figure 2:
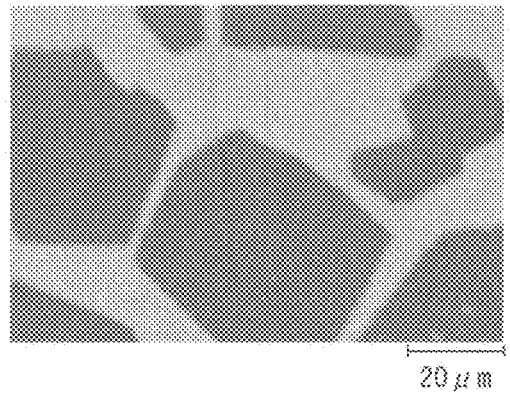
FIG. 2 shows an image in cross section of a diamond composite material of sample No. 1-3 produced in a test example 1, as observed with an electron probe microanalyzer (EPMA), with an upper left image being a backscattered electron image, a lower left image being an oxygen (O) mapping image, an upper right image being a carbon (C) mapping image, and a lower right image being a Ti mapping image.
Figure 2:
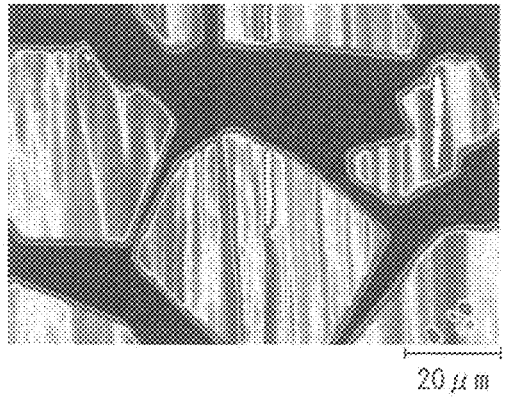
Figure 2:
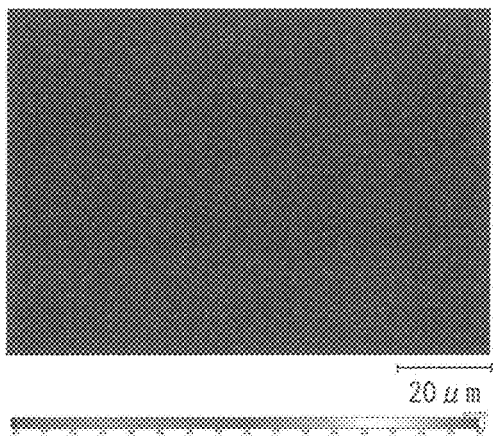
Figure 2:
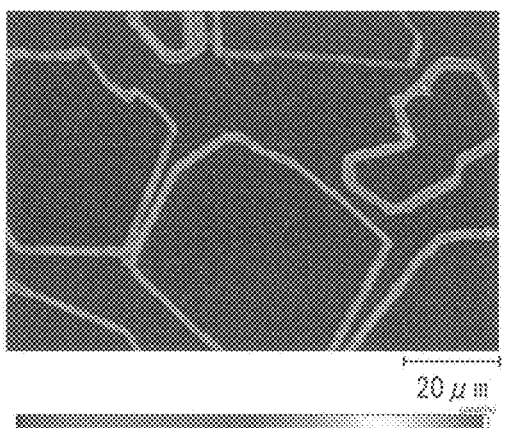
Figure 3:
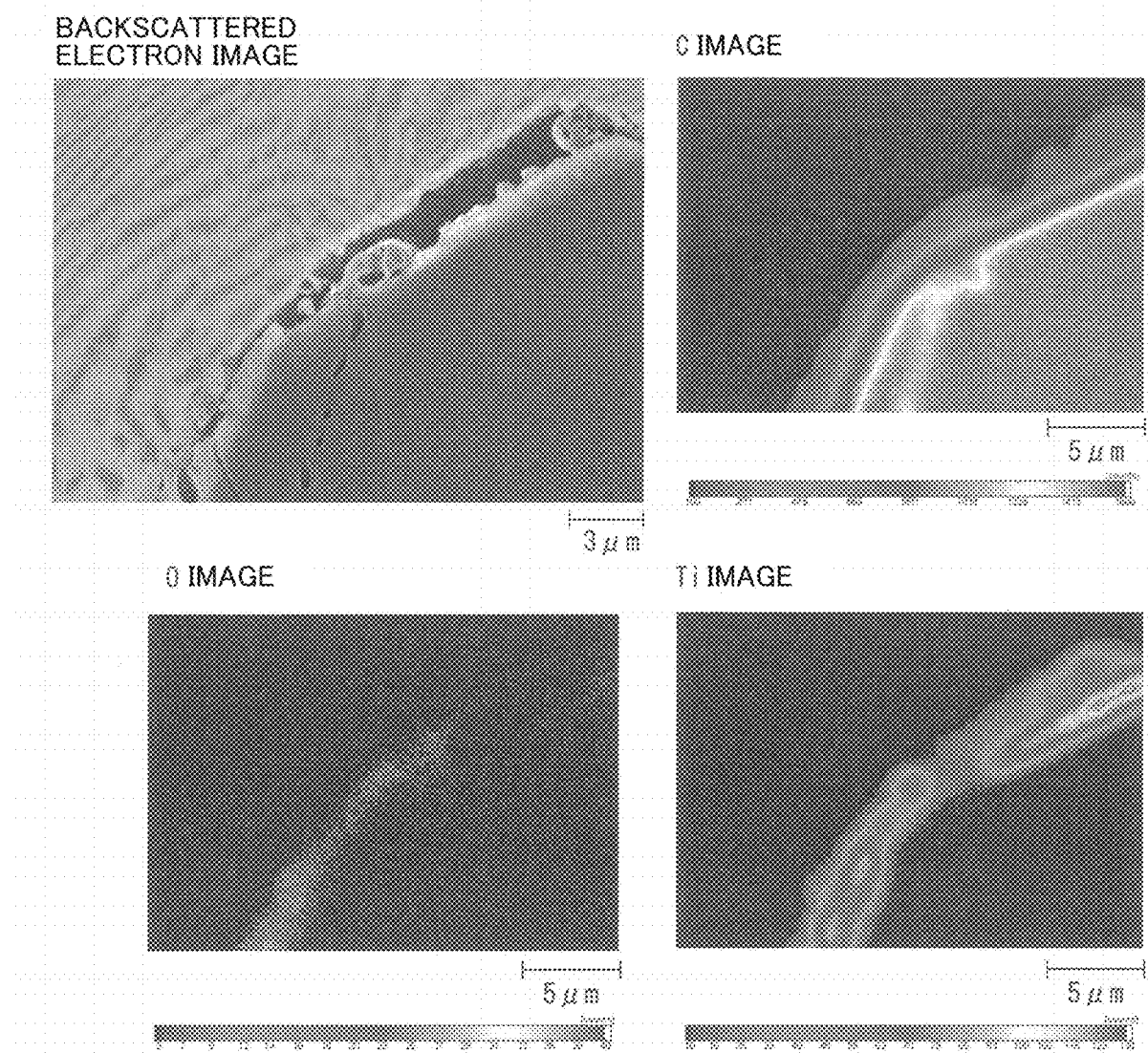
FIG. 3 shows an image in cross section of a diamond composite material of sample No. 1-102 produced in test example 1, as observed with the EPMA in a vicinity of a diamond particle, with an upper left image being a backscattered electron image, a lower left image being an O mapping image, an upper right image being a C mapping image, and a lower right image being a Ti mapping image.

Regarding each obtained sample's infiltrated material, a commercially available cross section polisher (CP) processing device was used to obtain a CP cross section, and regarding this cross section, an EPMA structure observation and an EPMA elemental analysis were conducted. FIG. 2 and FIG. 3 show an observed image and an elemental mapping image (elemental image). The elemental mapping images via EPMA of FIG. 2 and FIG. 3 show extracted elements' high and low concentrations in different colors. An element's concentration is represented in a descending order by white followed by red followed by orange followed by yellow followed by green followed by pale blue followed by blue followed by black. A color scale is shown under each mapping image of each element.

In FIG. 2, an upper left image is an EPMA backscattered electron image of the infiltrated material of sample No. 1-3, and lower left, upper right, and lower right images are EPMA oxygen, carbon and titanium mapping images, respectively.

In FIG. 3, an upper left image is an EPMA backscattered electron image of the infiltrated material of sample No. 1-102 in a vicinity of a diamond particle in an enlarged view, and lower left, upper right, and lower right images are EPMA oxygen, carbon and titanium mapping images, respectively.

In the backscattered electron images of FIG. 2 and FIG. 3, a polygonal, deep gray area indicates diamond and a pale gray area indicates a metal matrix (in this example, silver). In the backscattered electron image of FIG. 3, between the polygonal, deep gray area and the pale gray area, a filmy area is present along a peripheral edge of the polygonal area.

It can be seen that, as shown in the backscattered electron image of FIG. 2, the infiltrated material of sample No. 1-3 is such that a gap formed by diamond particles is filled with a metal matrix (in this example, silver) substantially without a gap. Furthermore, as is apparent from the oxygen mapping image of the lower left image of FIG. 2 being completely in black, it can be seen that the infiltrated material of sample No. 1-3 contains as little oxygen as substantially undetectable throughout its entirety.

When the carbon mapping image of the upper right image of FIG. 2 is observed, polygonal particles are generally white, red and yellow and thus have high carbon concentration, and can thus be determined to be diamond. It can be seen that, along the contour of the polygonal particle, an area having a low carbon concentration (i.e., a green area) is present in the form of a thin loop. That is, it can be determined that a region of the diamond particle closer to a surface thereof has a low carbon concentration. When the titanium mapping image of the lower right image of FIG. 2 is observed, it can be seen that, along the contour of the polygonal particle, an area having a high titanium concentration (i.e., an area generally of green to blue) is present in the form of a thin loop. When considering it together with the above described carbon mapping image, it can be seen that titanium is present in a loop along the contour of the diamond particle.

Furthermore, when the three elemental mapping images shown in FIG. 2 are superposed, the loop area having a relatively low carbon concentration and the loop area having a high titanium concentration substantially overlap, and it can be seen that substantially there is no oxygen overlapping this loop area. From this, it can be determined that the thin loop area along the contour of the diamond particle is an area in which carbon and titanium bond together and are thus present as a carbide and oxygen is substantially absent. This carbide's carbon content is present along the peripheral edge of the diamond particle, and accordingly, can be determined as being attributed to the diamond. Note that the loop area composed of the carbide (a carbide layer) has an average thickness of about 3 μm or less. Furthermore, from the oxygen mapping image of FIG. 2, it can be seen that oxygen is substantially absent not only in the above described loop area but also throughout the composite material.

In contrast, as is apparent from the oxygen mapping image of the lower left image of FIG. 3, a portion of blue to yellow is present, and it can be seen that in the infiltrated material of sample No. 1-102, oxygen is locally present. When the three elemental mapping images shown in FIG. 3 are superposed, it can be seen that, regarding a filmy area along the contour of the diamond particle, a portion of the filmy area having a relatively low carbon concentration and a portion of the area having a high titanium concentration overlap, and another portion of the area having a high titanium concentration and an area having a high oxygen concentration overlap. It can be determined that while the filmy area along the contour of the diamond particle does have a portion which has carbon and titanium bonded together and thus exists as a carbide, the area also has a portion which has oxygen and titanium bonded together and thus exists as an oxide. From this, it has been confirmed that when a production condition is varied, an infiltrated material in which oxygen is substantially absent in a vicinity of the diamond particle and an infiltrated material in which oxygen may be present are obtained.

The infiltrated materials of samples Nos. 1-1, 1-2, 1-4 to 1-12 have also been observed and analyzed similarly as sample No. 1-3 has, and it has been confirmed that a gap formed by diamond particles is filled with a metal matrix (in this example, silver) substantially without a gap, that in a region of the diamond particle closer to a surface thereof a thin carbide layer of group 4 of the periodic table is present, and that each infiltrated material has a low oxygen concentration throughout its entirety including a vicinity of a surface of the diamond particle. The infiltrated materials of samples Nos. 1-1 to 1-12 are composite materials comprising a coated diamond particle including a diamond particle and a carbide layer covering a surface of the diamond particle and including an element of group 4 of the periodic table (in this example, a carbide layer in which the diamond particle and the element of group 4 of the periodic table are bonded together, in particular), and silver binding such coated diamond particles together.

TABLE 1

| | raw materials | | | | | | composite material | | | | |
|---|---|---|---|---|---|---|---|---|---|---|---|
| | diamond | | powder α including element of group 4 of periodic table | | | metal | | | | | |
| sample No. | average particle diameter μm | content volume % | material | average particle diameter μm | content volume % | material | content volume % | thermal conductivity W/m·K | coefficient of thermal expansion ppm/K | relative density % | cold and hot cycle endurance % | amount of oxygen mass % |
| 1-1 | 50 | 60 | TiS$_2$ | 45 | 2 | Ag | 38 | 605 | 6.1 | 97.8 | 98 | 0.040 |
| 1-2 | 50 | 60 | TiN | 45 | 2 | Ag | 38 | 620 | 6.0 | 98.3 | 100 | 0.038 |
| 1-3 | 50 | 60 | TiH$_2$ | 45 | 2 | Ag | 38 | 610 | 5.9 | 98.0 | 100 | 0.040 |
| 1-4 | 50 | 60 | TiB$_2$ | 45 | 2 | Ag | 38 | 615 | 5.8 | 98.1 | 99 | 0.050 |
| 1-5 | 50 | 60 | ZrS$_2$ | 45 | 2 | Ag | 38 | 598 | 5.9 | 97.5 | 98 | 0.053 |
| 1-6 | 50 | 60 | ZrN | 45 | 2 | Ag | 38 | 612 | 6.0 | 97.8 | 100 | 0.050 |
| 1-7 | 50 | 60 | ZrH$_2$ | 45 | 2 | Ag | 38 | 603 | 6.0 | 97.7 | 99 | 0.055 |
| 1-8 | 50 | 60 | ZrB$_2$ | 45 | 2 | Ag | 38 | 600 | 5.9 | 97.7 | 99 | 0.050 |
| 1-9 | 50 | 60 | HfS$_2$ | 45 | 2 | Ag | 38 | 590 | 6.0 | 96.8 | 96 | 0.055 |
| 1-10 | 50 | 60 | HfN | 45 | 2 | Ag | 38 | 585 | 6.1 | 97.2 | 99 | 0.048 |
| 1-11 | 50 | 60 | HfH$_2$ | 45 | 2 | Ag | 38 | 585 | 6.0 | 96.9 | 96 | 0.045 |
| 1-12 | 50 | 60 | HfB$_2$ | 45 | 2 | Ag | 38 | 595 | 6.2 | 97.0 | 97 | 0.050 |
| 1-101 | 50 | 60 | — | — | — | Ag | 40 | | | no filtration | | |
| 1-102 | 50 | 60 | Ti | 45 | 2 | Ag | 38 | 422 | 5.9 | 96.4 | 94 | 0.165 |
| 1-103 | 50 | 60 | Zr | 45 | 2 | Ag | 38 | 410 | 6.0 | 96.2 | 94 | 0.200 |
| 1-104 | 50 | 60 | Hf | 45 | 2 | Ag | 38 | 408 | 6.1 | 95.7 | 92 | 0.200 |

And it can be seen that, as shown in table 1, the composite materials of samples Nos. 1-1 to 1-12 all have a low oxygen content, are dense and have an excellent thermal property. Specifically, the composite materials of samples Nos. 1-1 to 1-12 all have an oxygen content of 0.1 mass % or less (in this example, 0.06 mass % or less), a high relative density (in this example, 96.8% or more), and a high thermal conductivity (in this example, 580 W/m·K or more). The composite materials of samples Nos. 1-1 to 1-12 are also all excellent in cold and hot cycle endurance (in this example, 95% or more), and can maintain a thermal conductivity of 500 W/m·K or more (in this example, 550 W/m·K or more) even when they undergo a cold and hot cycle.

It is believed that the above result has been obtained because using as a raw material a powder of a group 4 compound including an element of group 4 of the periodic table can suppress oxidation of the element of group 4 of the periodic table in the production process and oxygen which may be present around a raw material can be reduced/removed by an effect of a particular element generated in a chemolysis of the above group 4 compound, and furthermore, the element of group 4 of the periodic table generated through the chemolysis and the diamond can react and thus efficiently form a carbide and thus enhance wettability with molten metal. In particular, it is believed that as oxygen can be reduced/removed in a vicinity of a surface of the diamond particle, a carbide of the element of group 4 of the periodic table can be satisfactorily formed, and as the diamond particle and the molten metal satisfactorily get wet, densification is achieved.

From this test, it can be seen that a diamond composite material which has a low oxygen content, is dense and has an excellent thermal property such as the composite materials of samples Nos. 1-1 to 1-12 can be easily produce by an infiltration method using the above described powder of a group 4 compound as a raw material.

Note that the composite materials of samples Nos. 1-1 to 1-12 had silver removed by acid and a coated diamond particle extracted therefrom, and its average particle diameter (median particle sizes) measured, and it has been found that they had substantially maintained the average particle diameter of the powder of diamond used as a raw material (i.e., about 45 μm). Furthermore, the volume ratio of the extracted coated diamond particle relative to the composite material has been found to substantially maintain the blending ratio of the powder of diamond used as a raw material (i.e., about 60 volume %). When considering that the carbide layer is extremely thin, it can be said that the particle diameter and volume ratio of the diamond particle in the composite material substantially maintain the state of the stage as a raw material. A diamond composite material produced in an exemplary test described later, which has a low oxygen content, is dense and has an excellent property, also had a metal matrix removed with acid and a coated diamond particle extracted therefrom, and had its average particle diameter, volume ratio, etc. measured as described above, and a similar result (maintenance of a stage as a raw material) has been obtained.

In contrast, sample No. 1-101, which did not use as a raw material the powder which includes the element of group 4 of the periodic table, failed to substantially provide an infiltrated material, and accordingly its thermal property, relative density and amount of oxygen have not been examined.

On the other hand samples Nos. 1-102 to 1-104, which used as a raw material a simple substance of the element of group 4 of the periodic table, did provide an infiltrated material, however, as compared with samples Nos. 1-1 to 1-12, samples Nos. 1-102 to 1-104 have a higher oxygen content (exceeding 0.15 mass %) and a lower relative density (less than 96.5%) and also has an inferior thermal property (with a thermal conductivity less than 500 W, and furthermore, less than 450 W, and a cold and hot cycle characteristic of 94% or less). It is believed that the above result has been obtained because by using as a raw material a simple substance of an element of group 4 of the periodic table, the element of group 4 of the periodic table is oxidized in a stage as the raw material, or the element of group 4 of the periodic table is oxidized by oxygen which may be present in a process for producing the infiltrated material or the like, and accordingly, a carbide of the element of group 4 of the periodic table cannot be satisfactorily formed (also see FIG. 3) and a portion which is insufficiently wet with the molten metal results. Note that, for example, it is believed that a difference between the amount of oxygen of sample No. 1-3 and the amount of oxygen of sample No. 1-102 is caused by a difference in an amount of oxygen included in an oxide which is present at the diamond particle and in a vicinity thereof with reference to the oxygen mapping images shown in FIG. 2 and FIG. 3.

[Exemplary Test 2]

The powder of diamond was varied in particle diameter to produce a variety of diamond composite materials and their thermal properties, relative densities, and amounts of oxygen were examined.

In this test, diamond composite materials were produced similarly as done in samples Nos. 1-1 to 1-12 of exemplary test 1, except for the particle diameter of the powder of diamond. The outline is as follows: powders of diamond having an average particle diameters of 0.1 μm, 1 μm, 20 μm, 50 μm, 100 μm, 300 μm, 400 μm, a silver (Ag) powder having an average particle diameter of 150 μm, and powders of group 4 compounds having an average particle diameter of 45 μm and composed of materials indicated in tables 2-4, were prepared. Adjustment was done such that for a volume having a diameter of 10 mmφ and a thickness of 2 mm, the powder of diamond was 60 volume %, the silver powder was 38 volume %, and the group 4 compound powder was 2 volume %. And the diamond powder and the group 4 compound powder were wet-blended and then dried, and then the mixture powder was introduced into a die of carbon and then pressed, and then the silver powder was introduced, and the powders were placed in an Ar atmosphere at 10° C./min at 1200° C.×2 hours to produce an infiltrated material (a disk having a diameter of 10 mmφ and a thickness of 2 mm) (samples Nos. 2-1 to 2-88, and 2-101 to 2-124).

In tables 2-4, for each sample indicated as having a blending ratio (coarse:fine) of 7:3, a mixture of a fine powder and a coarse powder was used as the diamond powder. In this test, a sample which uses a powder having an average particle diameter of 50 μm as a coarse particle powder and a powder having an average particle diameter of 10 μm as a fine particle powder (Nos. 2-3, 2-33, 2-63 etc.,), and a sample which uses a powder having an average particle diameter of 300 μm as a coarse particle powder and a powder having an average particle diameter of 1 μm as a fine particle powder (Nos. 2-6, 2-36, 2-66, etc.), were prepared (both presented in median particle size). Any of the samples had the coarse particle powder blended in a larger amount such that the coarse particle powder and the fine particle powder were blended at a ratio of 7:3, as represented as a volume ratio.

The infiltrated materials of samples Nos. 2-1 to 2-88, and 2-101 to 2-124 thus obtained had their respective thermal conductivities (W/m·K), coefficients of thermal expansion ($\times 10^{-6}$/K=ppm/K), relative densities (%), cold and hot cycle endurances (%), and oxygen contents (amounts of oxygen, mass %) measured, similarly as done in exemplary test 1. A result thereof is shown in table 4. Table 2 indicates samples Nos. 2-1 to 2-28 and samples Nos. 2-101 to 2-104 in which the element of group 4 of the periodic table included in the group 4 compound is Ti, Table 3 indicates samples Nos. 2-31 to 2-58 and samples Nos. 2-111 to 2-114 in which the element of group 4 of the periodic table included in the group 4 compound is Zr, and Table 4 indicates samples Nos. 2-61 to 2-88 and samples Nos. 2-121 to 2-124 in which the element of group 4 of the periodic table included in the group 4 compound is Hf.

TABLE 2

| | raw materials | | | | | | | | composite material | | | | |
|---|---|---|---|---|---|---|---|---|---|---|---|---|---|
| | diamond | | | | group 4 compound | | metal | | | | | | |
| | coarse particle | fine particle | | content | | average particle | content | | | thermal | coefficient | | cold and | amount |
| sample No. | diameter μm | diameter μm | mixing ratio coarse:fine | volume % | material | diameter μm | volume % | material | content volume % | conductivity W/m·K | of thermal expansion ppm/K | relative density % | hot cycle endurance % | of oxygen mass % |
| 2-1 | 1 | — | — | 60 | TiS$_2$ | 45 | 2 | Ag | 38 | 533 | 5.9 | 96.5 | 97 | 0.078 |
| 2-2 | 20 | — | — | 60 | TiS$_2$ | 45 | 2 | Ag | 38 | 550 | 6.0 | 97.5 | 100 | 0.055 |
| 1-1 | 50 | — | — | 60 | TiS$_2$ | 45 | 2 | Ag | 38 | 605 | 6.1 | 97.8 | 98 | 0.040 |
| 2-3 | 50 | 10 | 7:3 | 60 | TiS$_2$ | 45 | 2 | Ag | 38 | 630 | 5.9 | 98.2 | 99 | 0.045 |
| 2-4 | 100 | — | — | 60 | TiS$_2$ | 45 | 2 | Ag | 38 | 680 | 6.1 | 96.6 | 97 | 0.035 |
| 2-5 | 300 | — | — | 60 | TiS$_2$ | 45 | 2 | Ag | 38 | 810 | 5.9 | 98.2 | 98 | 0.025 |
| 2-6 | 300 | 1 | 7:3 | 60 | TiS$_2$ | 45 | 2 | Ag | 38 | 812 | 6.0 | 98.5 | 96 | 0.040 |
| 2-101 | 0.1 | — | — | 60 | TiS$_2$ | 45 | 2 | Ag | 38 | 450 | 5.8 | 96.2 | 92 | 0.115 |
| 2-7 | 400 | — | — | 60 | TiS$_2$ | 45 | 2 | Ag | 38 | 825 | 6.0 | 97.5 | 97 | 0.040 |
| 2-8 | 1 | — | — | 60 | TiN | 45 | 2 | Ag | 38 | 532 | 5.9 | 96.8 | 97 | 0.088 |
| 2-9 | 20 | — | — | 60 | TiN | 45 | 2 | Ag | 38 | 549 | 6.0 | 97.3 | 99 | 0.052 |
| 1-2 | 50 | — | — | 60 | TiN | 45 | 2 | Ag | 38 | 620 | 6.0 | 98.3 | 100 | 0.038 |
| 2-10 | 50 | 10 | 7:3 | 60 | TiN | 45 | 2 | Ag | 38 | 630 | 6.0 | 98.5 | 99 | 0.042 |
| 2-11 | 100 | — | — | 60 | TiN | 45 | 2 | Ag | 38 | 700 | 5.9 | 97.0 | 98 | 0.038 |
| 2-12 | 300 | — | — | 60 | TiN | 45 | 2 | Ag | 38 | 835 | 6.0 | 97.9 | 99 | 0.020 |
| 2-13 | 300 | 1 | 7:3 | 60 | TiN | 45 | 2 | Ag | 38 | 842 | 6.1 | 98.2 | 98 | 0.028 |
| 2-102 | 0.1 | — | — | 60 | TiN | 45 | 2 | Ag | 38 | 470 | 5.9 | 96.4 | 92 | 0.132 |
| 2-14 | 400 | — | — | 60 | TiN | 45 | 2 | Ag | 38 | 850 | 6.0 | 97.5 | 96 | 0.035 |
| 2-15 | 1 | — | — | 60 | TiH$_2$ | 45 | 2 | Ag | 38 | 530 | 5.8 | 96.7 | 96 | 0.085 |
| 2-16 | 20 | — | — | 60 | TiH$_2$ | 45 | 2 | Ag | 38 | 542 | 5.9 | 97.2 | 99 | 0.055 |
| 1-3 | 50 | — | — | 60 | TiH$_2$ | 45 | 2 | Ag | 38 | 610 | 5.9 | 98.0 | 100 | 0.040 |
| 2-17 | 50 | 10 | 7:3 | 60 | TiH$_2$ | 45 | 2 | Ag | 38 | 623 | 5.9 | 98.4 | 99 | 0.040 |
| 2-18 | 100 | — | — | 60 | TiH$_2$ | 45 | 2 | Ag | 38 | 709 | 6.0 | 96.9 | 97 | 0.035 |
| 2-19 | 300 | — | — | 60 | TiH$_2$ | 45 | 2 | Ag | 38 | 845 | 5.9 | 98.2 | 98 | 0.025 |
| 2-20 | 300 | 1 | 7:3 | 60 | TiH$_2$ | 45 | 2 | Ag | 38 | 852 | 6.0 | 98.5 | 97 | 0.030 |

TABLE 2-continued

| | raw materials | | | | | | | composite material | | | | |
|---|---|---|---|---|---|---|---|---|---|---|---|---|
| | diamond | | | | group 4 compound | | metal | | | | | |
| | coarse particle | fine particle | | | average particle | | | thermal | coefficient of thermal | relative | cold and hot cycle | amount of |
| sample No. | diameter μm | diameter μm | mixing ratio coarse:fine | content volume % | material | diameter μm | content volume % | material | content volume % | conductivity W/m·K | expansion ppm/K | density % | endurance % | oxygen mass % |
|---|---|---|---|---|---|---|---|---|---|---|---|---|---|---|
| 2-103 | 0.1 | — | — | 60 | TiH$_2$ | 45 | 2 | Ag | 38 | 465 | 5.9 | 96.6 | 94 | 0.105 |
| 2-21 | 400 | — | — | 60 | TiH$_2$ | 45 | 2 | Ag | 38 | 850 | 6.0 | 97.4 | 96 | 0.030 |
| 2-22 | 1 | — | — | 60 | TiB$_2$ | 45 | 2 | Ag | 38 | 530 | 5.8 | 96.5 | 97 | 0.082 |
| 2-23 | 20 | — | — | 60 | TiB$_2$ | 45 | 2 | Ag | 38 | 550 | 5.9 | 97.3 | 99 | 0.050 |
| 1-4 | 50 | — | — | 60 | TiB$_2$ | 45 | 2 | Ag | 38 | 615 | 5.8 | 98.1 | 99 | 0.050 |
| 2-24 | 50 | 10 | 7:3 | 60 | TiB$_2$ | 45 | 2 | Ag | 38 | 630 | 6.0 | 98.5 | 100 | 0.040 |
| 2-25 | 100 | — | — | 60 | TiB$_2$ | 45 | 2 | Ag | 38 | 715 | 6.0 | 97.0 | 98 | 0.030 |
| 2-26 | 300 | — | — | 60 | TiB$_2$ | 45 | 2 | Ag | 38 | 840 | 5.8 | 97.2 | 98 | 0.032 |
| 2-27 | 300 | 1 | 7:3 | 60 | TiB$_2$ | 45 | 2 | Ag | 38 | 842 | 5.8 | 98.2 | 98 | 0.030 |
| 2-104 | 0.1 | — | — | 60 | TiB$_2$ | 45 | 2 | Ag | 38 | 430 | 5.9 | 96.6 | 93 | 0.112 |
| 2-28 | 400 | — | — | 60 | TiB$_2$ | 45 | 2 | Ag | 38 | 840 | 6.1 | 97.2 | 96 | 0.033 |

TABLE 3

| | raw materials | | | | | | | | | composite material | | | | |
|---|---|---|---|---|---|---|---|---|---|---|---|---|---|---|
| | diamond | | | | group 4 compound | | | metal | | | coefficient | | cold and hot | amount |
| | coarse | fine | | | | average | | | | thermal | of | | cycle | of |
| sample No. | particle diameter μm | particle diameter μm | mixing ratio coarse:fine | content volume % | material | particle diameter μm | content volume % | material | content volume % | conductivity W/m·K | thermal expansion ppm/K | relative density % | endurance % | oxygen mass % |
|---|---|---|---|---|---|---|---|---|---|---|---|---|---|---|
| 2-31 | 1 | — | — | 60 | ZrS$_2$ | 45 | 2 | Ag | 38 | 528 | 5.9 | 96.6 | 97 | 0.099 |
| 2-32 | 20 | — | — | 60 | ZrS$_2$ | 45 | 2 | Ag | 38 | 530 | 6.0 | 97.3 | 99 | 0.060 |
| 1-5 | 50 | — | — | 60 | ZrS$_2$ | 45 | 2 | Ag | 38 | 598 | 5.9 | 97.5 | 98 | 0.053 |
| 2-33 | 50 | 10 | 7:3 | 60 | ZrS$_2$ | 45 | 2 | Ag | 38 | 612 | 6.0 | 97.8 | 99 | 0.055 |
| 2-34 | 100 | — | — | 60 | ZrS$_2$ | 45 | 2 | Ag | 38 | 708 | 6.1 | 96.9 | 98 | 0.045 |
| 2-35 | 300 | — | — | 60 | ZrS$_2$ | 45 | 2 | Ag | 38 | 809 | 6.0 | 98.3 | 97 | 0.030 |
| 2-36 | 300 | 1 | 7:3 | 60 | ZrS$_2$ | 45 | 2 | Ag | 38 | 811 | 6.0 | 98.7 | 98 | 0.028 |
| 2-111 | 0.1 | — | — | 60 | ZrS$_2$ | 45 | 2 | Ag | 38 | 428 | 6.0 | 96.0 | 91 | 0.130 |
| 2-37 | 400 | — | — | 60 | ZrS$_2$ | 45 | 2 | Ag | 38 | 820 | 6.1 | 97.0 | 95 | 0.045 |
| 2-38 | 1 | — | — | 60 | ZrN | 45 | 2 | Ag | 38 | 530 | 5.9 | 96.5 | 97 | 0.090 |
| 2-39 | 20 | — | — | 60 | ZrN | 45 | 2 | Ag | 38 | 538 | 6.1 | 97.3 | 98 | 0.062 |
| 1-6 | 50 | — | — | 60 | ZrN | 45 | 2 | Ag | 38 | 612 | 6.0 | 97.8 | 100 | 0.050 |
| 2-40 | 50 | 10 | 7:3 | 60 | ZrN | 45 | 2 | Ag | 38 | 618 | 6.0 | 98.0 | 99 | 0.045 |
| 2-41 | 100 | — | — | 60 | ZrN | 45 | 2 | Ag | 38 | 715 | 6.1 | 97.2 | 98 | 0.030 |
| 2-42 | 300 | — | — | 60 | ZrN | 45 | 2 | Ag | 38 | 812 | 6.1 | 97.9 | 97 | 0.045 |
| 2-43 | 300 | 1 | 7:3 | 60 | ZrN | 45 | 2 | Ag | 38 | 828 | 6.0 | 98.1 | 97 | 0.030 |
| 2-112 | 0.1 | — | — | 60 | ZrN | 45 | 2 | Ag | 38 | 433 | 6.0 | 96.5 | 91 | 0.125 |
| 2-44 | 400 | — | — | 60 | ZrN | 45 | 2 | Ag | 38 | 822 | 6.1 | 97.1 | 95 | 0.044 |
| 2-45 | 1 | — | — | 60 | ZrH$_2$ | 45 | 2 | Ag | 38 | 531 | 6.0 | 97.3 | 97 | 0.078 |
| 2-46 | 20 | — | — | 60 | ZrH$_2$ | 45 | 2 | Ag | 38 | 550 | 5.9 | 97.5 | 98 | 0.055 |
| 1-7 | 50 | — | — | 60 | ZrH$_2$ | 45 | 2 | Ag | 38 | 603 | 6.0 | 97.7 | 99 | 0.055 |
| 2-47 | 50 | 10 | 7:3 | 60 | ZrH$_2$ | 45 | 2 | Ag | 38 | 614 | 6.0 | 98.6 | 99 | 0.043 |
| 2-48 | 100 | — | — | 60 | ZrH$_2$ | 45 | 2 | Ag | 38 | 702 | 6.0 | 96.7 | 98 | 0.042 |
| 2-49 | 300 | — | — | 60 | ZrH$_2$ | 45 | 2 | Ag | 38 | 818 | 5.9 | 98.0 | 99 | 0.033 |
| 2-50 | 300 | 1 | 7:3 | 60 | ZrH$_2$ | 45 | 2 | Ag | 38 | 820 | 6.1 | 98.1 | 98 | 0.044 |
| 2-113 | 0.1 | — | — | 60 | ZrH$_2$ | 45 | 2 | Ag | 38 | 441 | 5.9 | 95.1 | 91 | 0.152 |
| 2-51 | 400 | — | — | 60 | ZrH$_2$ | 45 | 2 | Ag | 38 | 828 | 6.0 | 96.6 | 95 | 0.038 |
| 2-52 | 1 | — | — | 60 | ZrB$_2$ | 45 | 2 | Ag | 38 | 528 | 6.0 | 97.3 | 96 | 0.075 |
| 2-53 | 20 | — | — | 60 | ZrB$_2$ | 45 | 2 | Ag | 38 | 540 | 5.9 | 97.2 | 98 | 0.060 |
| 1-8 | 50 | — | — | 60 | ZrB$_2$ | 45 | 2 | Ag | 38 | 600 | 5.9 | 97.7 | 99 | 0.050 |
| 2-54 | 50 | 10 | 7:3 | 60 | ZrB$_2$ | 45 | 2 | Ag | 38 | 612 | 6.0 | 98.5 | 99 | 0.045 |
| 2-55 | 100 | — | — | 60 | ZrB$_2$ | 45 | 2 | Ag | 38 | 700 | 6.0 | 96.6 | 98 | 0.040 |
| 2-56 | 300 | — | — | 60 | ZrB$_2$ | 45 | 2 | Ag | 38 | 820 | 5.9 | 98.1 | 99 | 0.030 |
| 2-57 | 300 | 1 | 7:3 | 60 | ZrB$_2$ | 45 | 2 | Ag | 38 | 822 | 6.1 | 98.2 | 97 | 0.040 |
| 2-114 | 0.1 | — | — | 60 | ZrB$_2$ | 45 | 2 | Ag | 38 | 442 | 5.9 | 95.2 | 91 | 0.144 |
| 2-58 | 400 | — | — | 60 | ZrB$_2$ | 45 | 2 | Ag | 38 | 830 | 6.0 | 96.9 | 95 | 0.035 |

TABLE 4

| | raw materials | | | | | | | | | composite material | | | | |
|---|---|---|---|---|---|---|---|---|---|---|---|---|---|---|
| | diamond | | | | group 4 compound | | | metal | | | thermal conductivity | coefficient of thermal expansion | relative density | cold and hot cycle endurance | amount of oxygen |
| sample No. | coarse particle diameter μm | fine particle diameter μm | mixing ratio coarse:fine | content volume % | material | average particle diameter μm | content volume % | material | content volume % | W/m·K | ppm/K | % | % | mass % |
| 2-61 | 1 | — | — | 60 | HfS₂ | 45 | 2 | Ag | 38 | 529 | 5.9 | 96.5 | 98 | 0.092 |
| 2-62 | 20 | — | — | 60 | HfS₂ | 45 | 2 | Ag | 38 | 550 | 5.8 | 97.0 | 97 | 0.070 |
| 1-9 | 50 | — | — | 60 | HfS₂ | 45 | 2 | Ag | 38 | 590 | 6.0 | 96.8 | 96 | 0.055 |
| 2-63 | 50 | 10 | 7:3 | 60 | HfS₂ | 45 | 2 | Ag | 38 | 595 | 5.9 | 97.2 | 97 | 0.065 |
| 2-64 | 100 | — | — | 60 | HfS₂ | 45 | 2 | Ag | 38 | 695 | 6.1 | 97.2 | 97 | 0.055 |
| 2-65 | 300 | — | — | 60 | HfS₂ | 45 | 2 | Ag | 38 | 783 | 6.0 | 97.9 | 98 | 0.036 |
| 2-66 | 300 | 1 | 7:3 | 60 | HfS₂ | 45 | 2 | Ag | 38 | 799 | 6.1 | 98.0 | 97 | 0.042 |
| 2-121 | 0.1 | — | — | 60 | HfS₂ | 45 | 2 | Ag | 38 | 420 | 6.0 | 96.1 | 89 | 0.152 |
| 2-67 | 400 | — | — | 60 | HfS₂ | 45 | 2 | Ag | 38 | 805 | 5.9 | 96.5 | 95 | 0.056 |
| 2-68 | 1 | — | — | 60 | HfN | 45 | 2 | Ag | 38 | 527 | 6.1 | 97.1 | 98 | 0.095 |
| 2-69 | 20 | — | — | 60 | HfN | 45 | 2 | Ag | 38 | 540 | 6.1 | 97.1 | 97 | 0.062 |
| 1-10 | 50 | — | — | 60 | HfN | 45 | 2 | Ag | 38 | 585 | 6.1 | 97.2 | 99 | 0.048 |
| 2-70 | 50 | 10 | 7:3 | 60 | HfN | 45 | 2 | Ag | 38 | 600 | 6.1 | 97.4 | 98 | 0.054 |
| 2-71 | 100 | — | — | 60 | HfN | 45 | 2 | Ag | 38 | 709 | 6.0 | 97.3 | 98 | 0.033 |
| 2-72 | 300 | — | — | 60 | HfN | 45 | 2 | Ag | 38 | 796 | 6.1 | 97.0 | 96 | 0.055 |
| 2-73 | 300 | 1 | 7:3 | 60 | HfN | 45 | 2 | Ag | 38 | 801 | 6.1 | 97.9 | 96 | 0.050 |
| 2-122 | 0.1 | — | — | 60 | HfN | 45 | 2 | Ag | 38 | 433 | 6.0 | 96.5 | 90 | 0.133 |
| 2-74 | 400 | — | — | 60 | HfN | 45 | 2 | Ag | 38 | 808 | 6.1 | 96.7 | 95 | 0.055 |
| 2-75 | 1 | — | — | 60 | HfH₂ | 45 | 2 | Ag | 38 | 532 | 6.1 | 96.9 | 96 | 0.083 |
| 2-76 | 20 | — | — | 60 | HfH₂ | 45 | 2 | Ag | 38 | 555 | 6.0 | 97.1 | 98 | 0.060 |
| 1-11 | 50 | — | — | 60 | HfH₂ | 45 | 2 | Ag | 38 | 585 | 6.0 | 96.9 | 96 | 0.045 |
| 2-77 | 50 | 10 | 7:3 | 60 | HfH₂ | 45 | 2 | Ag | 38 | 602 | 6.1 | 98.3 | 99 | 0.053 |
| 2-78 | 100 | — | — | 60 | HfH₂ | 45 | 2 | Ag | 38 | 693 | 6.1 | 96.5 | 98 | 0.055 |
| 2-79 | 300 | — | — | 60 | HfH₂ | 45 | 2 | Ag | 38 | 805 | 6.0 | 97.9 | 98 | 0.044 |
| 2-80 | 300 | 1 | 7:3 | 60 | HfH₂ | 45 | 2 | Ag | 38 | 815 | 6.1 | 98.3 | 98 | 0.045 |
| 2-123 | 0.1 | — | — | 60 | HfH₂ | 45 | 2 | Ag | 38 | 413 | 6.0 | 94.2 | 90 | 0.155 |
| 2-81 | 400 | — | — | 60 | HfH₂ | 45 | 2 | Ag | 38 | 815 | 6.1 | 97.2 | 95 | 0.045 |
| 2-82 | 1 | — | — | 60 | HfB₂ | 45 | 2 | Ag | 38 | 512 | 6.1 | 96.9 | 95 | 0.080 |
| 2-83 | 20 | — | — | 60 | HfB₂ | 45 | 2 | Ag | 38 | 525 | 6.0 | 97.1 | 98 | 0.065 |
| 1-12 | 50 | — | — | 60 | HfB₂ | 45 | 2 | Ag | 38 | 595 | 6.2 | 97.0 | 97 | 0.050 |
| 2-84 | 50 | 10 | 7:3 | 60 | HfB₂ | 45 | 2 | Ag | 38 | 600 | 6.1 | 98.3 | 99 | 0.050 |
| 2-85 | 100 | — | — | 60 | HfB₂ | 45 | 2 | Ag | 38 | 690 | 6.1 | 96.5 | 97 | 0.055 |
| 2-86 | 300 | — | — | 60 | HfB₂ | 45 | 2 | Ag | 38 | 802 | 6.0 | 97.9 | 98 | 0.042 |
| 2-87 | 300 | 1 | 7:3 | 60 | HfB₂ | 45 | 2 | Ag | 38 | 812 | 6.1 | 98.3 | 98 | 0.045 |
| 2-124 | 0.1 | — | — | 60 | HfB₂ | 45 | 2 | Ag | 38 | 410 | 6.0 | 94.2 | 90 | 0.155 |
| 2-88 | 400 | — | — | 60 | HfB₂ | 45 | 2 | Ag | 38 | 814 | 6.1 | 97.2 | 95 | 0.045 |

The infiltrated materials of samples Nos. 2-1 to 2-88 obtained were all composite materials which comprise a coated diamond particle including a diamond particle and a carbide layer covering a surface of the diamond particle and including an element of group 4 of the periodic table (in this example, a TiC layer, a ZrC layer, or a HfC layer in which the diamond particle and the element of group 4 of the periodic table are bonded together, in particular), and silver binding such coated diamond particles together. And it can be seen that, as shown in table 2 to table 4, the composite materials of samples Nos. 2-1 to 2-88 all have a low oxygen content, are dense, and have an excellent thermal property. Specifically, the composite materials of samples Nos. 2-1 to 2-88 have an oxygen content of 0.1 mass % or less (in this example, most of the samples have an oxygen content of 0.06 mass % or less), a high relative density (in this example, most of the samples have a relative density of 97.0% or more), and a high thermal conductivity (in this example, most of the samples have a thermal conductivity of 600 W/m·K or more). Furthermore, the composite materials of samples Nos. 2-1 to 2-88 also have an excellent cold and hot cycle endurance (in this example, most of the samples have a cold and hot cycle endurance of 96% or more), and most of the samples satisfy 500 W/m·K or more even when they undergo a cold and hot cycle. And it can be seen that, as shown in table 2 to table 4, a larger diamond particle allows more excellent thermal conductivity. In this test, a composite material having a thermal conductivity of 700 W/m·K or more (for example, samples Nos. 2-11, 2-34, 2-71, etc.), and furthermore, a composite material having a thermal conductivity of 800 W/m·K or more (for example, samples Nos. 2-5, 2-42, 2-79, etc.) were obtained. However, it is believed that a sample with an excessively large diamond particle (in this example, a sample which used a diamond powder with an average particle diameter of 400 μm) is inferior in workability such as polishing and cutting, and it is believed that a preferable average particle diameter of the diamond particle in the composite material is less than 400 μm, furthermore, 300 μm or less.

In particular, when the composite material of a sample using a mixture of a fine powder and a coarse powder as diamond powder is compared with a sample which does not use a mixture of a fine powder and a coarse powder, it can be said that the former is more easily, significantly increased in relative density and more easily become denser. Furthermore, when a sample using a mixture of a fine powder and a coarse powder is compared with a sample which does not use a mixture of a fine powder and a coarse powder, e.g., when a sample which uses a diamond powder with an average particle diameter of 50 μm as the coarse particle powder is compared with a sample using a diamond powder with an average particle diameter of 50 μm alone, it can be said that using the mixture of a fine powder and a coarse powder provides a tendency to increase thermal conductivity and more easily enhances thermal conductivity.

In contrast, the composite materials of samples Nos. 2-101 to 2-124 did use a group 4 compound powder as a raw material, however, as compared with the other samples, have a high oxygen content exceeding 0.1 mass % and also have a low thermal property. As reasons for this are indicated that as they had excessively small diamond particles and accordingly, an oxide which may be present at the diamond particle was relatively increased and insufficiently removed or could not be removed and as a result the oxide remained, that they had many diamond powder particle boundaries and hence a long heat path, and that they had diamond particles having an increased surface area and hence had an increased thermal loss at an interface of the diamond and the Ag.

From this test, it can be seen that it is preferable that a diamond composite material which has a low oxygen content, is dense and has an excellent thermal property, such as the composite materials of samples Nos. 2-1 to 2-88, be such that the diamond in the composite material has an average particle diameter satisfying a size exceeding 0.1 μm and 400 μm or less, furthermore, 1 μm or more and 300 μm or less.

[Exemplary Test 3]

The powder of diamond and the metal powder were blended at different ratios to produce a variety of diamond composite materials and their thermal properties, relative densities and amounts of oxygen were examined.

In this test, mainly except that the diamond powder and the metal powder were blended at a ratio different than exemplary test 1, diamond composite materials were produced similarly as done in samples Nos. 1-1 to 1-12 of exemplary test 1. Depending on the sample, the particle diameter of the diamond powder and the material(s) of the metal powder were also changed from exemplary test 1. The outline is as follows: powders of diamond having average particle diameters of 1 μm, 50 μm, and 300 μm, a silver (Ag) powder having an average particle diameter of 150 μm or a powder of a silver alloy including 28 mass % of Cu (Ag-28 mass % Cu), and powders of group 4 compounds having an average particle diameter of 45 μm and composed of materials indicated in tables 5-7, were prepared. Adjustment was done such that for a volume having a diameter of 10 mmφ and a thickness of 2 mm, the powder of diamond was 25 volume %, 29 volume %, 30 volume %, 45 volume %, 60 volume %, 75 volume %, 90 volume %, or 95 volume %, the silver powder or the silver alloy powder had a value indicated in table 5 to table 7, and the powder of the group 4 compound was 2 volume %. And the diamond powder and the group 4 compound powder were wet-blended and then dried, and then the mixture powder was introduced into a die of carbon and then pressed, and then the silver powder or the silver alloy was introduced, and the powders were placed in an Ar atmosphere at 10° C./min at 1200° C.×2 hours to produce an infiltrated material (a disk having a diameter of 10 mmφ and a thickness of 2 mm) (samples Nos. 3-1 to 3-80, 3-101 to 3-104, 3-111 to 3-114, 3-121 to 3-124).

Samples Nos. 3-125 to 3-127 are all samples which did not use the above group 4 compound powder. Specifically, a powder of diamond having an average particle diameter of 1 μm, a powder of a silver alloy having an average particle diameter of 150 μm (Ag-28 mass % Cu), and powders of elements of group 4 of the periodic table having an average particle diameter of 45 μm (titanium (Ti) powder, zirconium (Zr) powder, and hafnium (Hf) powder) were prepared. Adjustment was done such that for a volume having a diameter of 10 mmφ and a thickness of 2 mm, the powder of diamond was 30 volume %, the silver alloy powder was 68 volume %, and the powder of the element of group 4 of the periodic table was 2 volume %. And an infiltrated material (a disk having a diameter of 10 mmφ and a thickness of 2 mm) was produced similarly as done in samples Nos. 3-1 to 3-80.

Sample No. 3-128 is a sample which did not use the above group 4 compound powder. Specifically, a powder of diamond having an average particle diameter of 50 μm, a powder of a silver alloy having an average particle diameter of 150 μm (Ag-28 mass % Cu), and a titanium (Ti) powder having an average particle diameter of 45 μm were prepared. Adjustment was done such that for a volume having a diameter of 10 mmφ and a thickness of 2 mm, the powder of diamond was 60 volume %, the silver alloy powder was 38 volume %, and the Ti powder was 2 volume %. And the Ti powder and the silver alloy powder were mixed together. This mixing was done by dry-blending using a mixer mill. And the diamond powder was introduced into a die of carbon and then pressed, and then the mixture powder of the silver alloy powder and the Ti powder was introduced, and the powders were placed in an Ar atmosphere (5 kPa) at 10° C./min at 1200° C.×2 hours to produce an infiltrated material (a disk having a diameter of 10 mmφ and a thickness of 2 mm).

The infiltrated materials of samples Nos. 3-1 to 3-80, 3-101 to 3-104, 3-111 to 3-114, 3-121 to 3-128 thus obtained had their respective thermal conductivities (W/m·K), coefficients of thermal expansion (×$10^{-6}$/K=ppm/K), relative densities (%), cold and hot cycle endurances (%), and oxygen contents (amounts of oxygen, mass %) measured, similarly as done in exemplary test 1. A result thereof is shown in table 5 to table 7. Table 5 indicates samples Nos. 3-1 to 3-23 and samples Nos. 3-101 to 3-108 in which the element of group 4 of the periodic table included in the group 4 compound is Ti, Table 6 indicates samples Nos. 3-31 to 3-50 and samples Nos. 3-111 to 3-118 in which the element of group 4 of the periodic table included in the group 4 compound is Zr, and Table 7 indicates samples Nos. 3-61 to 3-80 and samples Nos. 3-121 to 3-132 in which the element of group 4 of the periodic table included in the group 4 compound is Hf.

TABLE 6

| sample No. | diamond average particle diameter μm | diamond content volume % | group 4 compound material | group 4 compound average particle diameter μm | group 4 compound content volume % | metal material | metal content volume % | thermal conductivity W/m·K | coefficient of thermal expansion ppm/K | relative density % | cold and hot cycle endurance % | amount of oxygen mass % |
|---|---|---|---|---|---|---|---|---|---|---|---|---|
| 3-1 | 1 | 29 | $TiS_2$ | 45 | 2 | Ag | 69 | 508 | 13.2 | 97.2 | 98 | 0.082 |
| 3-2 | 1 | 30 | $TiS_2$ | 45 | 2 | Ag | 68 | 515 | 12.9 | 97.0 | 97 | 0.079 |
| 3-3 | 50 | 30 | $TiS_2$ | 45 | 2 | Ag | 68 | 542 | 12.9 | 97.0 | 99 | 0.070 |
| 3-4 | 50 | 45 | $TiS_2$ | 45 | 2 | Ag | 53 | 559 | 9.3 | 97.8 | 98 | 0.088 |
| 1-1 | 50 | 60 | $TiS_2$ | 45 | 2 | Ag | 38 | 605 | 6.1 | 97.8 | 98 | 0.040 |
| 3-5 | 50 | 60 | $TiS_2$ | 45 | 2 | Ag—28Cu | 38 | 545 | 5.8 | 96.8 | 95 | 0.090 |
| 3-6 | 50 | 75 | $TiS_2$ | 45 | 2 | Ag | 23 | 643 | 4.5 | 97.6 | 99 | 0.030 |
| 3-7 | 50 | 90 | $TiS_2$ | 45 | 2 | Ag | 8 | 679 | 3.1 | 96.9 | 99 | 0.030 |
| 3-101 | 50 | 25 | $TiS_2$ | 45 | 2 | Ag | 73 | 468 | 14.0 | 96.0 | 92 | 0.115 |
| 3-105 | 50 | 95 | $TiS_2$ | 45 | 2 | Ag | 3 | no filtration | | | | |
| 3-8 | 300 | 90 | $TiS_2$ | 45 | 2 | Ag | 8 | 900 | 3.0 | 96.7 | 96 | 0.030 |
| 3-9 | 50 | 30 | TiN | 45 | 2 | Ag | 68 | 533 | 12.8 | 96.7 | 99 | 0.092 |
| 3-10 | 50 | 45 | TiN | 45 | 2 | Ag | 53 | 572 | 9.4 | 97.2 | 97 | 0.071 |
| 1-2 | 50 | 60 | TiN | 45 | 2 | Ag | 38 | 620 | 6.0 | 98.3 | 100 | 0.038 |
| 3-11 | 50 | 60 | TiN | 45 | 2 | Ag—28Cu | 38 | 552 | 5.8 | 96.5 | 96 | 0.088 |
| 3-12 | 50 | 75 | TiN | 45 | 2 | Ag | 23 | 644 | 4.4 | 97.6 | 98 | 0.035 |
| 3-13 | 50 | 90 | TiN | 45 | 2 | Ag | 8 | 688 | 3.1 | 97.2 | 98 | 0.035 |
| 3-102 | 50 | 25 | TiN | 45 | 2 | Ag | 73 | 460 | 13.9 | 96.4 | 92 | 0.125 |
| 3-106 | 50 | 95 | TiN | 45 | 2 | Ag | 3 | no filtration | | | | |
| 3-14 | 50 | 30 | $TiH_2$ | 45 | 2 | Ag | 68 | 538 | 12.8 | 96.6 | 98 | 0.090 |
| 3-15 | 50 | 45 | $TiH_2$ | 45 | 2 | Ag | 53 | 566 | 9.3 | 97.9 | 97 | 0.070 |
| 1-3 | 50 | 60 | $TiH_2$ | 45 | 2 | Ag | 38 | 610 | 5.9 | 98.0 | 100 | 0.040 |
| 3-16 | 50 | 60 | $TiH_2$ | 45 | 2 | Ag—28Cu | 38 | 540 | 5.8 | 96.8 | 95 | 0.090 |
| 3-17 | 50 | 75 | $TiH_2$ | 45 | 2 | Ag | 23 | 643 | 4.5 | 97.6 | 99 | 0.030 |
| 3-18 | 50 | 90 | $TiH_2$ | 45 | 2 | Ag | 8 | 679 | 3.1 | 96.9 | 99 | 0.030 |
| 3-103 | 50 | 25 | $TiH_2$ | 45 | 2 | Ag | 73 | 468 | 14.0 | 96.4 | 93 | 0.105 |
| 3-107 | 50 | 95 | $TiH_2$ | 45 | 2 | Ag | 3 | no filtration | | | | |
| 3-19 | 50 | 30 | $TiB_2$ | 45 | 2 | Ag | 68 | 542 | 12.7 | 96.8 | 97 | 0.088 |
| 3-20 | 50 | 45 | $TiB_2$ | 45 | 2 | Ag | 53 | 576 | 9.4 | 97.8 | 98 | 0.068 |
| 1-4 | 50 | 60 | $TiB_2$ | 45 | 2 | Ag | 38 | 615 | 5.8 | 98.1 | 99 | 0.050 |
| 3-21 | 50 | 60 | $TiB_2$ | 45 | 2 | Ag—28Cu | 38 | 552 | 5.8 | 96.7 | 96 | 0.072 |
| 3-22 | 50 | 75 | $TiB_2$ | 45 | 2 | Ag | 23 | 652 | 4.4 | 97.2 | 98 | 0.042 |
| 3-23 | 50 | 90 | $TiB_2$ | 45 | 2 | Ag | 8 | 681 | 3.0 | 96.5 | 98 | 0.033 |
| 3-104 | 50 | 25 | $TiB_2$ | 45 | 2 | Ag | 73 | 462 | 14.0 | 96.2 | 93 | 0.112 |
| 3-108 | 50 | 95 | $TiB_2$ | 45 | 2 | Ag | 3 | no filtration | | | | |
| 3-31 | 50 | 30 | $ZrS_2$ | 45 | 2 | Ag | 68 | 537 | 12.9 | 96.5 | 99 | 0.087 |
| 3-32 | 50 | 45 | $ZrS_2$ | 45 | 2 | Ag | 53 | 550 | 9.2 | 97.8 | 98 | 0.090 |
| 1-5 | 50 | 60 | $ZrS_2$ | 45 | 2 | Ag | 38 | 598 | 5.9 | 97.5 | 98 | 0.053 |
| 3-33 | 50 | 60 | $ZrS_2$ | 45 | 2 | Ag—28Cu | 38 | 530 | 5.7 | 96.5 | 96 | 0.078 |
| 3-34 | 50 | 75 | $ZrS_2$ | 45 | 2 | Ag | 23 | 620 | 4.4 | 97.5 | 98 | 0.043 |
| 3-35 | 50 | 90 | $ZrS_2$ | 45 | 2 | Ag | 8 | 651 | 3.0 | 96.5 | 97 | 0.035 |
| 3-111 | 50 | 25 | $ZrS_2$ | 45 | 2 | Ag | 73 | 440 | 13.9 | 96.1 | 91 | 0.122 |
| 3-115 | 50 | 95 | $ZrS_2$ | 45 | 2 | Ag | 3 | no filtration | | | | |
| 3-36 | 50 | 30 | ZrN | 45 | 2 | Ag | 68 | 530 | 12.8 | 96.8 | 99 | 0.089 |
| 3-37 | 50 | 45 | ZrN | 45 | 2 | Ag | 53 | 560 | 9.4 | 98.1 | 98 | 0.078 |
| 1-6 | 50 | 60 | ZrN | 45 | 2 | Ag | 38 | 612 | 6.0 | 97.8 | 100 | 0.050 |
| 3-38 | 50 | 60 | ZrN | 45 | 2 | Ag—28Cu | 38 | 538 | 5.9 | 96.8 | 96 | 0.087 |
| 3-39 | 50 | 75 | ZrN | 45 | 2 | Ag | 23 | 622 | 4.4 | 97.6 | 98 | 0.040 |
| 3-40 | 50 | 90 | ZrN | 45 | 2 | Ag | 8 | 660 | 3.1 | 97.1 | 98 | 0.040 |
| 3-112 | 50 | 25 | ZrN | 45 | 2 | Ag | 73 | 448 | 14.0 | 96.0 | 90 | 0.140 |
| 3-116 | 50 | 95 | ZrN | 45 | 2 | Ag | 3 | no filtration | | | | |
| 3-41 | 50 | 30 | $ZrH_2$ | 45 | 2 | Ag | 68 | 532 | 12.7 | 96.5 | 98 | 0.098 |
| 3-42 | 50 | 45 | $ZrH_2$ | 45 | 2 | Ag | 53 | 566 | 9.2 | 97.8 | | 0.075 |

TABLE 6-continued

| | raw materials | | | | | | composite material | | | | |
|---|---|---|---|---|---|---|---|---|---|---|---|
| | diamond | | group 4 compound | | | | | | | | |
| | average particle | content | | average particle | content | metal | | thermal | coefficient of thermal | relative | cold and hot cycle | amount of |
| sample No. | diameter μm | volume % | material | diameter μm | volume % | material | content volume % | conductivity W/m·K | expansion ppm/K | density % | endurance % | oxygen mass % |
| 1-7 | 50 | 60 | ZrH$_2$ | 45 | 2 | Ag | 38 | 603 | 6.0 | 97.7 | 99 | 0.055 |
| 3-43 | 50 | 60 | ZrH$_2$ | 45 | 2 | Ag—28Cu | 38 | 543 | 5.8 | 96.9 | 96 | 0.084 |
| 3-44 | 50 | 75 | ZrH$_2$ | 45 | 2 | Ag | 23 | 631 | 4.4 | 97.2 | 98 | 0.042 |
| 3-45 | 50 | 90 | ZrH$_2$ | 45 | 2 | Ag | 8 | 660 | 3.1 | 97.1 | 98 | 0.030 |
| 3-113 | 50 | 25 | ZrH$_2$ | 45 | 2 | Ag | 73 | 454 | 14.0 | 96.2 | 91 | 0.133 |
| 3-117 | 50 | 95 | ZrH$_2$ | 45 | 2 | Ag | 3 | | | no filtration | | |
| 3-46 | 50 | 30 | ZrB$_2$ | 45 | 2 | Ag | 68 | 532 | 12.7 | 96.5 | 98 | 0.095 |
| 3-47 | 50 | 45 | ZrB$_2$ | 45 | 2 | Ag | 53 | 556 | 9.2 | 97.8 | 98 | 0.072 |
| 1-8 | 50 | 60 | ZrB$_2$ | 45 | 2 | Ag | 38 | 600 | 5.9 | 97.7 | 99 | 0.050 |
| 3-48 | 50 | 60 | ZrB$_2$ | 45 | 2 | Ag—28Cu | 38 | 533 | 5.8 | 96.9 | 96 | 0.088 |
| 3-49 | 50 | 75 | ZrB$_2$ | 45 | 2 | Ag | 23 | 621 | 4.4 | 97.2 | 98 | 0.045 |
| 3-50 | 50 | 90 | ZrB$_2$ | 45 | 2 | Ag | 8 | 662 | 3.1 | 97.1 | 98 | 0.033 |
| 3-114 | 50 | 25 | ZrB$_2$ | 45 | 2 | Ag | 73 | 452 | 14.0 | 96.2 | 91 | 0.132 |
| 3-118 | 50 | 95 | ZrB$_2$ | 45 | 2 | Ag | 3 | | | no filtration | | |

TABLE 7

| | raw materials | | | | | | composite material | | | | |
|---|---|---|---|---|---|---|---|---|---|---|---|
| | diamond | | group 4 compound | | | | | | | | |
| | average particle | content | | average particle | content | metal | | thermal | coefficient of thermal | relative | cold and hot cycle | amount of |
| sample No. | diameter μm | volume % | material | diameter μm | volume % | material | content volume % | conductivity W/m·K | expansion ppm/K | density % | endurance % | oxygen mass % |
| 3-61 | 50 | 30 | HfS$_2$ | 45 | 2 | Ag | 68 | 528 | 12.7 | 96.8 | 99 | 0.087 |
| 3-62 | 50 | 45 | HfS$_2$ | 45 | 2 | Ag | 53 | 540 | 9.4 | 97.2 | 97 | 0.070 |
| 1-9 | 50 | 60 | HfS$_2$ | 45 | 2 | Ag | 38 | 590 | 6.0 | 96.8 | 96 | 0.055 |
| 3-63 | 50 | 60 | HfS$_2$ | 45 | 2 | Ag—28Cu | 38 | 505 | 5.9 | 97.0 | 96 | 0.082 |
| 3-64 | 50 | 75 | HfS$_2$ | 45 | 2 | Ag | 23 | 600 | 4.5 | 97.2 | 97 | 0.055 |
| 3-65 | 50 | 90 | HfS$_2$ | 45 | 2 | Ag | 8 | 626 | 3.1 | 97.2 | 97 | 0.045 |
| 3-121 | 50 | 25 | HfS$_2$ | 45 | 2 | Ag | 73 | 415 | 14.0 | 97.0 | 90 | 0.176 |
| 3-129 | 50 | 95 | HfS$_2$ | 45 | 2 | Ag | 3 | | | no filtration | | |
| 3-66 | 50 | 30 | HfN | 45 | 2 | Ag | 68 | 532 | 12.8 | 96.5 | 98 | 0.090 |
| 3-67 | 50 | 45 | HfN | 45 | 2 | Ag | 53 | 543 | 9.2 | 97.2 | 98 | 0.066 |
| 1-10 | 50 | 60 | HfN | 45 | 2 | Ag | 38 | 585 | 6.1 | 97.2 | 99 | 0.048 |
| 3-68 | 50 | 60 | HfN | 45 | 2 | Ag—28Cu | 38 | 518 | 5.9 | 96.6 | 96 | 0.087 |
| 3-69 | 50 | 75 | HfN | 45 | 2 | Ag | 23 | 609 | 4.4 | 97.2 | 98 | 0.045 |
| 3-70 | 50 | 90 | HfN | 45 | 2 | Ag | 8 | 633 | 3.1 | 96.5 | 97 | 0.040 |
| 3-122 | 50 | 25 | HfN | 45 | 2 | Ag | 73 | 418 | 14.1 | 95.1 | 90 | 0.166 |
| 3-130 | 50 | 95 | HfN | 45 | 2 | Ag | 3 | | | no filtration | | |
| 3-71 | 50 | 30 | HfH$_2$ | 45 | 2 | Ag | 68 | 529 | 12.9 | 96.5 | 98 | 0.093 |
| 3-72 | 50 | 45 | HfH$_2$ | 45 | 2 | Ag | 53 | 543 | 9.5 | 98.1 | 98 | 0.085 |
| 1-11 | 50 | 60 | HfH$_2$ | 45 | 2 | Ag | 38 | 585 | 6.0 | 96.9 | 96 | 0.045 |
| 3-73 | 50 | 60 | HfH$_2$ | 45 | 2 | Ag—28Cu | 38 | 532 | 5.7 | 96.8 | 96 | 0.088 |
| 3-74 | 50 | 75 | HfH$_2$ | 45 | 2 | Ag | 23 | 612 | 4.4 | 96.9 | 97 | 0.035 |
| 3-75 | 50 | 90 | HfH$_2$ | 45 | 2 | Ag | 8 | 631 | 3.0 | 97.1 | 98 | 0.043 |
| 3-123 | 50 | 25 | HfH$_2$ | 45 | 2 | Ag | 73 | 423 | 13.9 | 96.2 | 90 | 0.156 |
| 3-131 | 50 | 95 | HfH$_2$ | 45 | 2 | Ag | 3 | | | no filtration | | |
| 3-76 | 50 | 30 | HfB$_2$ | 45 | 2 | Ag | 68 | 512 | 12.9 | 96.5 | 98 | 0.090 |
| 3-77 | 50 | 45 | HfB$_2$ | 45 | 2 | Ag | 53 | 540 | 9.5 | 98.1 | 98 | 0.089 |
| 1-12 | 50 | 60 | HfB$_2$ | 45 | 2 | Ag | 38 | 595 | 6.2 | 97.0 | 97 | 0.050 |
| 3-78 | 50 | 60 | HfB$_2$ | 45 | 2 | Ag—28Cu | 38 | 522 | 5.7 | 96.8 | 96 | 0.087 |
| 3-79 | 50 | 75 | HfB$_2$ | 45 | 2 | Ag | 23 | 610 | 4.4 | 96.9 | 97 | 0.033 |
| 3-80 | 50 | 90 | HfB$_2$ | 45 | 2 | Ag | 8 | 641 | 3.0 | 97.1 | 98 | 0.044 |
| 3-124 | 50 | 25 | HfB$_2$ | 45 | 2 | Ag | 73 | 422 | 13.9 | 96.2 | 90 | 0.155 |
| 3-132 | 50 | 95 | HfB$_2$ | 45 | 2 | Ag | 3 | | | no filtration | | |
| 3-125 | 1 | 30 | Ti | 45 | 2 | Ag—28Cu | 68 | 387 | 5.8 | 95.2 | 93 | 0.145 |
| 3-126 | 1 | 30 | Zr | 45 | 2 | Ag—28Cu | 68 | 376 | 5.7 | 95.4 | 91 | 0.167 |
| 3-127 | 1 | 30 | Hf | 45 | 2 | Ag—28Cu | 68 | 365 | 5.8 | 94.9 | 90 | 0.170 |
| 3-128 | 50 | 60 | — | — | — | Ag—28Cu Ti added | 38 2 | 473 | 5.7 | 93.8 | 91 | 0.175 |

The infiltrated materials of samples Nos. 3-1 to 3-80 obtained were all composite materials comprising a coated diamond particle including a diamond particle and a carbide layer covering a surface of the diamond particle and including an element of group 4 of the periodic table (in this example, a TiC layer, a ZrC layer, or a HfC layer in which the diamond particle and the element of group 4 of the periodic table are bonded together, in particular), and silver or a silver alloy binding such coated diamond particles together (samples Nos. 3-5, 3-33, 3-63, etc.). And it can be seen that, as shown in table 5 to table 7, the composite materials of samples Nos. 3-1 to 3-80 all have a low oxygen content, are dense, and have an excellent thermal property. Specifically, the composite materials of samples Nos. 3-1 to 3-80 have an oxygen content of 0.1 mass % or less, a high relative density (in this example, 96.5% or more), and a high thermal conductivity (in this example, 500 W/m·K or more). Furthermore, the composite materials of samples Nos. 3-1 to 3-80 also all have an excellent cold and hot cycle endurance (in this example, 95% or more). It can be seen that even a case where the metal matrix is a silver alloy, such as the composite materials of samples Nos. 3-5, 3-33 and 3-63, has a low oxygen content, is dense, and has an excellent thermal property. And it can be seen that, as shown in table 5 to table 7, a larger content of diamond particles allows more excellent thermal conductivity.

The infiltrated materials of samples Nos. 3-101 to 3-104, 3-111 to 3-114, and 3-121 to 3-124, which have a small content of diamond particles and include a metal matrix, or silver, in a large amount, have a high oxygen content exceeding 0.1 mass % and also have a low thermal property. It is believed that this is because the samples include diamond, which is excellent in thermal conductivity, in a small content and in addition, there is excessive silver present which may contain oxygen and as a result there is excessive oxygen present, and accordingly, although the above described group 4 compound powder was used as a raw material, a reducing action etc. cannot be exhibited sufficiently and an oxide is thus present.

Samples Nos. 3-105 to 3-108, 3-115 to 3-118, and 3-129 to 3-132, which have a large content of diamond particles and include a metal matrix, or silver, in a small amount, did have infiltration only into a portion of a stack of layers, however, the samples could not provide an infiltrated material of a prescribed size (in this example, a disk having a diameter of 10 mmφ and a thickness of 2 mm, the oxygen content measuring material described above), and accordingly, their thermal properties, relative densities, and amounts of oxygen have not been examined. It is believed that the insufficient infiltration was provided because the amount of the metal powder used as a raw material was insufficient, and the metal matrix and hence the carbide layer were insufficiently formed.

In contrast, samples Nos. 3-125 to 3-127, which used as a raw material a simple substance of an element of group 4 of the periodic table, did provide an infiltrated material, however, the samples, as well as samples Nos. 1-102 to 1-104 produced in exemplary test 1, have a high oxygen content, and also have a low relative density, and also have an inferior thermal property. On the other hand, sample No. 3-128, which used as a raw material a silver alloy powder with an element of group 4 of the periodic table added thereto did provide an infiltrated material, however, the sample has a larger oxygen content and also has a lower relative density, and also has a poorer thermal property than sample No. 3-125. From this, it can be seen that, to produce a diamond composite material which is dense, has an excellent thermal property and also has a low oxygen concentration, it is preferable that as a raw material, rather than a simple substance of an element of group 4 of the periodic table, a group 4 compound such as a sulfide, a nitride, a hydride and a boride including an element of group 4 of the periodic table be used and that at least a portion of a powder of the group 4 compound is mixed with a powder of diamond and thus used.

From this test, it can be seen that it is preferable that a diamond composite material which has a low oxygen content, is dense and has an excellent thermal property, such as the composite materials of samples Nos. 3-1 to 3-80, be such that the composite material has a diamond content more than 25 volume % and less than 95 volume %, and furthermore, 30 volume % or more and 90 volume % or less.

[Exemplary Test 4]

A variety of methods were employed to produce coated composite materials having a metal layer and their thermal properties, relative densities, amounts of oxygen, and surface roughnesses were examined. The relative density was obtained with the metal layer included.

Herein, the infiltrated materials of samples Nos. 1-1 to 1-12 produced in exemplary test 1, the infiltrated materials of samples Nos. 2-1, 2-3, 2-6 produced in exemplary test 2, and the infiltrated material of sample No. 3-2 produced in exemplary test 3 were prepared, and the metal layer was formed on a surface of each infiltrated material by metal-plating, compression-bonding of metal foil, or compression-bonding of metal powder. In the compression bonding, a hot press in which heating at 400° C. and a pressure of 4 tons/cm$^2$≈392 MPa were applied was performed to adhere metal foil, metal powder, etc. The metal plating was done under a known condition. The sample number of the infiltrated material, the material of the metal layer, and the method for forming the metal layer, that were used for the coated composite material of each sample, are indicated in table 8. Each sample's coated composite material had a size such that the infiltrated material, the metal layer, etc. were adjusted in thickness, etc. so that in a state where the metal layer was included the coated composite material was a disk having a diameter of 10 mmφ and a thickness of 2.2 mm and the metal layer had a thickness having a value indicated in table 8. The infiltrated materials of samples Nos. 4-1 to 4-23 thus obtained had their respective thermal conductivities (W/m·K), coefficients of thermal expansion (×10$^{-6}$/K=ppm/K), relative densities (%), cold and hot cycle endurances (%), and oxygen contents (amounts of oxygen, mass %) measured, similarly as done in exemplary test 1. A result thereof is shown in table 8.

TABLE 8

| sample No. | infiltrated material sample No. | material of metal layer | formation method | thickness of metal layer μm | thermal conductivity W/m · K | coefficient of thermal expansion ppm/K | relative density % | cold and hot cycle endurance % | amount of oxygen mass % |
|---|---|---|---|---|---|---|---|---|---|
| 4-1 | 1-1 | Ag | plating | 0.5 | 603 | 6.1 | 97.8 | 98 | 0.043 |
| 4-2 | 3-2 | Ag | plating | 0.5 | 510 | 12.9 | 97.0 | 97 | 0.080 |

TABLE 8-continued

| sample No. | infiltrated material sample No. | material of metal layer | formation method | thickness of metal layer μm | thermal conductivity W/m · K | coefficient of thermal expansion ppm/K | relative density % | cold and hot cycle endurance % | amount of oxygen mass % |
|---|---|---|---|---|---|---|---|---|---|
| 4-3 | 1-1 | Ag | plating | 1 | 600 | 6.1 | 97.8 | 98 | 0.055 |
| 4-4 | 1-1 | Ag | foil used, 400° C. 4 tons/cm² | 50 | 595 | 6.2 | 98.1 | 98 | 0.045 |
| 4-5 | 1-1 | Ag | powder not used, 400° C. 4 tons/cm² | 100 | 590 | 6.3 | 98.1 | 99 | 0.048 |
| 4-6 | 1-2 | Ag | foil used, 400° C. 4 tons/cm² | 100 | 600 | 6.2 | 98.9 | 100 | 0.041 |
| 4-7 | 1-3 | Ag | foil used, 400° C. 4 tons/cm² | 100 | 599 | 6.0 | 99.2 | 100 | 0.040 |
| 4-8 | 1-4 | Ag | foil used, 400° C. 4 tons/cm² | 100 | 605 | 6.0 | 98.5 | 99 | 0.053 |
| 4-9 | 1-5 | Ag | foil used, 400° C. 4 tons/cm² | 100 | 590 | 6.1 | 98.3 | 99 | 0.055 |
| 4-10 | 1-6 | Ag | foil used, 400° C. 4 tons/cm² | 100 | 602 | 6.0 | 98.4 | 100 | 0.054 |
| 4-11 | 1-7 | Ag | foil used, 400° C. 4 tons/cm² | 100 | 593 | 6.1 | 98.2 | 99 | 0.055 |
| 4-12 | 1-8 | Ag | foil used, 400° C. 4 tons/cm² | 100 | 590 | 6.0 | 98.5 | 99 | 0.054 |
| 4-13 | 1-9 | Ag | foil used, 400° C. 4 tons/cm² | 100 | 585 | 6.1 | 97.2 | 97 | 0.055 |
| 4-14 | 1-10 | Ag | foil used, 400° C. 4 tons/cm² | 100 | 575 | 6.2 | 98.0 | 99 | 0.050 |
| 4-15 | 1-11 | Ag | foil used, 400° C. 4 tons/cm² | 100 | 578 | 6.0 | 97.6 | 97 | 0.045 |
| 4-16 | 1-12 | Ag | foil used, 400° C. 4 tons/cm² | 100 | 585 | 6.3 | 97.2 | 99 | 0.055 |
| 4-17 | 2-1 | Ag | foil used, 400° C. 4 tons/cm² | 100 | 525 | 6.0 | 97.3 | 98 | 0.080 |
| 4-18 | 2-3 | Ag | foil used, 400° C. 4 tons/cm² | 100 | 620 | 6.0 | 98.9 | 100 | 0.050 |
| 4-19 | 2-6 | Ag | foil used, 400° C. 4 tons/cm² | 100 | 800 | 6.2 | 98.9 | 97 | 0.045 |
| 4-20 | 1-1 | Ag—28Cu | foil used, 400° C. 4 tons/cm² | 100 | 570 | 6.1 | 98.1 | 98 | 0.050 |
| 4-21 | 1-1 | Ag | foil used, 400° C. 4 tons/cm² | 200 | 580 | 6.2 | 98.1 | 98 | 0.050 |
| 4-22 | 1-1 | Ag | foil used, 400° C. 4 tons/cm² | 300 | 570 | 6.3 | 98.1 | 98 | 0.053 |
| 4-23 | 3-2 | Ag | foil used, 400° C. 4 tons/cm² | 300 | 500 | 13.0 | 98.0 | 97 | 0.080 |

As shown in table 8, it can be seen that even a coated composite material including a metal layer is also excellent in thermal conductivity if it has a low oxygen content and is dense and the metal layer is 300 μm or less in thickness. In particular, forming the metal layer by hot press allows a composite material to have a tendency to have a higher relative density, and hence be denser. This is because the hot press has reduced voids.

Other than this, in this test, it can be said that an effect on a thermal property by a difference between raw materials of the metal layer, such as metal foil and metal powder, an effect on a thermal property by a difference in composition of the metal layer, an effect on a thermal property by a difference in how the metal layer is formed, such as hot press and plating, are all small. Furthermore, from this test, it can be said that the oxygen content may be more or less increased when the metal layer has a composition which easily contains oxygen (e.g., includes Cu), the metal layer is thick, etc.

[Exemplary Test 5]

The samples produced in exemplary test 1 to exemplary test 3 were heated to high temperature and thereafter how their thermal properties degraded was examined.

Herein, the infiltrated materials of samples Nos. 1-1 and 1-102 produced in exemplary test 1, the infiltrated materials of samples Nos. 2-1, 2-3, 2-6 produced in exemplary test 2, and the infiltrated material of sample No. 3-2 produced in exemplary test 3 were prepared. The infiltrated material of each sample prepared was heated in a hydrogen atmosphere and held at 800° C. for 1 hour and subsequently, cooled to room temperature and its thermal conductivity was measured similarly as done in exemplary test 1. And by what degree a thermal conductivity before the heating was decreased after the heating was evaluated.

The evaluation was done by calculating degradation rate={[(thermal conductivity before heating)−(thermal conductivity after heating)]/(thermal conductivity before heating}×100. Here, the thermal conductivity (W/m·K) after the heating and the degradation rate (%) were measured regarding a case where the heating was done once under the above described condition (i.e., the first heat treatment) and a case where the heating was done twice under the above described condition (i.e., the second heat treatment). A result thereof is shown in table 9.

TABLE 9

| sample No. | infiltrated material sample No. | thermal conductivity before heat treatment (W/m·K) | 1st heat treatment | | 2nd heat treatment | |
|---|---|---|---|---|---|---|
| | | | thermal conductivity after heat treatment at 800° C. | degradation rate (%) | thermal conductivity after heat treatment at 800° C. | degradation rate (%) |
| 5-1 | 1-1 | 605 | 590 | 2.5 | 585 | 3.3 |
| 5-2 | 2-1 | 533 | 528 | 0.9 | 525 | 1.5 |
| 5-3 | 2-3 | 630 | 625 | 0.8 | 620 | 1.6 |
| 5-4 | 2-6 | 812 | 800 | 1.5 | 780 | 3.9 |
| 5-5 | 3-2 | 515 | 510 | 1.0 | 508 | 1.4 |
| 5-6 | 1-102 | 422 | 398 | 5.7 | 370 | 12.3 |

It can be seen that, as indicated in table 9, samples Nos. 5-1 to 5-5, which are diamond composite materials having an excellent thermal property before they are heated to 800° C., all have small reduction in thermal conductivity even when they are heated at 800° C., and they are thus excellent in heat resistance. Specifically, any of the samples has a thermal conductivity degradation rate less than 5% even when it is heated to 800° C. In this test, it has a thermal conductivity degradation rate less than 5% even when it is heated twice. On the other hand, sample No. 5-6, which has a thermal property inferior to sample No. 5-1 before it is heated at 800° C., also has a large reduction in thermal conductivity when it is heated to 800° C., and the sample presents a degradation rate of 5% or more, and when it is heated twice it presents a degradation rate of 10% or more.

When a diamond composite material that has a small oxygen content, is dense and has a high thermal conductivity, such as the composite materials of samples Nos. 5-1 to 5-5, has little reduction in thermal conductivity even when it is heated to such a high temperature that simulates bonding by a silver brazing material. It can be seen that such a composite material can maintain high thermal conductivity even after it is applied to a heat radiating member and has a bonding material of a high melt point such as a silver brazing material bonded thereto.

The present invention is not limited to the above embodiments and can be modified as appropriate within a range which does not depart from the gist of the present invention, and is intended to include any modifications within the meaning and scope indicated by and equivalent to the terms of the claims.

INDUSTRIAL APPLICABILITY

The heat radiating member of the present invention is applicable to a heat radiating member of a semiconductor element used for a CPU (a Central Processing Unit), a GPU (a Graphics Processing Unit), a HEMT (a High Electron Mobility Transistor), a chip set, a memory chip, etc. included in supercomputers as well as a personal computers, and mobile electronic devices, etc. The diamond composite material of the present invention is applicable to a material for a heat radiating member in which high heat radiation is desired, such as the heat radiating member of the semiconductor element above. The method of producing the composite material of diamond according to the present invention is applicable to producing a diamond composite material which mainly includes diamond and silver or a silver alloy and is dense and excellent in thermal conductivity.

REFERENCE SIGNS LIST 1, 1A: diamond composite material; 1B: coated composite material
2, 21: diamond particle; 3: carbide layer;
4: coated diamond particle; 5: metal matrix; 6: metal layer;
20: powder of diamond; 30: powder of group 4 compound; 23: mixture powder;
50: metal powder;
235: stack of layers; 2355: stack of layers with metal on opposite sides;
52: molten metal; 54: composite molten metal;
100: die; 110: container; 120: lid;
300: group 4 compound; 301: element of group 4 of the periodic table;
302: constituent element of group 4 compound other than element of group 4 of the periodic table
600: oxygen; 640: gaseous compound

The invention claimed is:
1. A diamond composite material comprising:
a diamond particle;
carbide layer covering a surface of the diamond particle and consisting essentially of TiC; and
binding material consisting of silver binding the diamond particle covered by the carbide layer together;
wherein the diamond composite material has an oxygen content of 0.1 mass % or less;
wherein the diamond particle in the diamond composite material has a surface at which, except for silver, only the carbide layer is present;
wherein the diamond composite material has a cold and hot cycle endurance of 95% or more at −60° C. to 250° C. and has a thermal conductivity degradation rate less than 5% after being heated to 800° C.;
wherein the TiC is made from $TiH_2$; and
wherein the TiC is made by a method comprising:
preparing a mixture powder including the diamond particle and $TiH_2$ in a container;
depositing silver on the mixture powder to form a stack of layers in the container;
increasing a temperature of the container to about 200° C. to 300° C., wherein the silver discharges oxygen and oxygen is contained in the layer of the mixture powder;
further increasing the temperature to about 500° C. to 600° C., wherein $TiH_2$ is chemically decomposed into Ti, hydrogen, and oxygen, and wherein hydrogen forms water vapor and is discharged from the mixture powder; and further increasing the temperature, wherein the silver enters into the mixture powder, takes in Ti, and Ti contacts the diamond particle to form the TiC.

2. The diamond composite material according to claim 1, having a relative density of 96.5% or more.

3. The diamond composite material according to claim 1, wherein the diamond particle has an average particle diameter of 1 μm or more and 300 μm or less.

4. The diamond composite material according to claim 1, wherein a content of the diamond particle is 30 volume % or more and 90 volume % or less.

5. The diamond composite material according to claim 1, having a thermal conductivity of 500 W/m·K or more at a room temperature.

6. The diamond composite material according to claim 1, having a coefficient of thermal expansion, as averaged, of $3 \times 10^{-6}$/K or more and $6.3 \times 10^{-6}$/K or less at 30° C. to 150° C.

7. The diamond composite material according to claim 1, further comprising a metal layer covering at least a portion of a surface of the diamond composite material, the metal layer having a thickness of 1 μm or more and 300 μm or less.

8. The diamond composite material according to claim 1, the binding material does not include copper.

9. A heat radiating member composed of a diamond composite material according to claim 1.

10. A method for producing a diamond composite material, the method comprising the steps of:

preparing a mixture powder including a diamond particle and $TiH_2$ in a container;
depositing silver on the mixture powder to form a stack of layers in the container;
increasing a temperature to about 200° C. to 300° C., wherein the silver powder discharges oxygen and oxygen is contained in the layer of the mixture powder;
further increasing the temperature to about 500° C. to 600° C., wherein $TiH_2$ is chemically decomposed into Ti, hydrogen, and oxygen, and hydrogen forms water vapor and is discharged from the mixture powder; and
further increasing the temperature, wherein the silver enters in the mixture powder, takes in Ti, and Ti contacts the diamond particle to form the carbide layer covering the surface of the diamond particle, which consists essentially of TiC;
wherein a gap formed between diamond particles covered by TiC is filled with silver,
wherein the diamond composite material has an oxygen content of 0.1 mass % or less,
wherein the diamond particle in the diamond composite material has a surface at which, except for silver, only a carbide layer consisting essentially of TiC is present,
wherein the diamond composite material has a cold and hot cycle endurance of 95% or more at −60° C. to 250° C. and has a thermal conductivity degradation rate less than 5% after being heated to 800° C.

* * * * *